(12) United States Patent
Lee

(10) Patent No.: US 8,295,084 B2
(45) Date of Patent: Oct. 23, 2012

(54) NONVOLATILE MEMORY DEVICE AND RELATED PROGRAMMING METHOD

(75) Inventor: Jong soo Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 331 days.

(21) Appl. No.: 12/786,732

(22) Filed: May 25, 2010

(65) Prior Publication Data

US 2010/0315873 A1  Dec. 16, 2010

(30) Foreign Application Priority Data

Jun. 15, 2009  (KR) .................. 10-2009-0052978

(51) Int. Cl.
*G11C 11/34* (2006.01)

(52) U.S. Cl. .............. 365/185.03; 365/173; 365/185.14; 365/185.28; 365/185.25

(58) Field of Classification Search ............. 365/185.03, 365/173, 185.14, 185.28, 185.25
See application file for complete search history.

(56) References Cited

U.S. PATENT DOCUMENTS

| 6,744,670 B2 | 6/2004 | Tamada et al. |
| 7,126,850 B2 | 10/2006 | Tatsukawa et al. |
| 2004/0015649 A1 | 1/2004 | Chang |
| 2008/0002468 A1* | 1/2008 | Hemink .................. 365/185.17 |

FOREIGN PATENT DOCUMENTS

| JP | 10055687 A | 2/1998 |
| JP | 2000298992 A | 10/2000 |
| JP | 2003242787 A | 8/2003 |
| JP | 2004055110 A | 2/2004 |
| JP | 2005100527 A | 4/2005 |
| KR | 1020040008532 A | 1/2004 |

* cited by examiner

*Primary Examiner* — Jason Lappas

(74) *Attorney, Agent, or Firm* — Volentine & Whitt, PLLC

(57) ABSTRACT

A method of programming a nonvolatile memory device comprises receiving program data, detecting logic states of the received program data, identifying adjusted margins to be applied to programmed memory cells based on the absence of one or more logic states in the detected logic states, and programming the program data in selected memory cells using the adjusted margins.

20 Claims, 21 Drawing Sheets

NONVOLATILE MEMORY DEVICE AND RELATED PROGRAMMING METHOD

CROSS-REFERENCE TO RELATED APPLICATIONS

This application claims priority under 35 U.S.C. §119 to Korean Patent Application No. 10-2009-0052978 filed on Jun. 15, 2009, the disclosure of which is hereby incorporated by reference in its entirety.

BACKGROUND

Embodiments of the inventive concept relate generally to semiconductor memory devices. More particularly, embodiments of the inventive concept relate to nonvolatile memory devices and related methods of programming.

Semiconductor memory devices can be roughly divided into two categories based on whether they retain stored data when disconnected from power. These categories include volatile memory devices, which lose stored data when disconnected from power, and nonvolatile memory devices, which retain stored data when disconnected from power.

Examples of volatile memory devices include dynamic random access memory (DRAM) and static random access memory (SRAM), and examples of nonvolatile memory devices include read only memory (ROM), programmable read only memory (PROM), erasable programmable read only memory (EPROM), electrically erasable programmable read only memory (EEPROM), ferroelectric random access memory (FRAM), phase-change random access memory (PRAM), resistive read only memory (RRAM), magnetoresistive random access memory (MRAM), and flash memory.

In recent years, there has been an increase in the number of devices employing nonvolatile memory devices. As examples, nonvolatile memory devices are being used increasingly in MP3 players, digital cameras, cellular phones, camcorders, flash cards, solid state drives (SSDs), to name but a few. In addition, there has also been an increase in the overall storage capacity of nonvolatile memory devices, resulting in a tremendous amount of nonvolatile data storage in use today.

SUMMARY

Embodiments of the inventive concept provide nonvolatile memory devices and methods of programming the nonvolatile memory devices. Some of these methods provide improved reliability compared with other programming methods.

According to one embodiment of the inventive concept, a method of programming a nonvolatile memory device, comprises receiving program data, detecting logic states of the received program data, identifying adjusted margins to be applied to programmed memory cells based on the absence of one or more logic states in the detected logic states, and programming the program data in selected memory cells using the adjusted margins.

In certain embodiments, the absence of one or more logic states is detected by comparing a number of program states available to each of the selected memory cells with a number of distinct logic states in the program data.

In certain embodiments, the program data is determined to have an absent logic state where the number of program states available to the memory cells is greater than the number of distinct logic states in the program data.

In certain embodiments, each of selected the memory cells is configured to store at least three bits.

In certain embodiments, the adjusted margins are adjusted to account for omission of one of the available program states corresponding to the absent logic state, and the adjusted margins are configured to separate program states of the selected memory cells by substantially equal amounts.

In certain embodiments, the method further comprises counting a number of occurrences of each of the logic states in the program data.

In certain embodiments, the method further comprises adjusting the margins such that a largest margin is assigned to a program state corresponding to a logic state having a largest number of occurrences.

In certain embodiments, the method further comprises adjusting the margins such that larger margins are assigned to program states corresponding to logic states having more occurrences.

In certain embodiments, detecting the logic states of the received program data comprises reading data stored in the nonvolatile memory device, and analyzing the stored data and the program data.

In certain embodiments, the method further comprises generating a mapping between the detected logic states and the program states based on which logic states are absent from the detected logic states.

In certain embodiments, the method further comprises storing supplemental data in the selected memory cells to indicate the adjusted margins used to program the program data.

According to another embodiment of the inventive concept, a method of programming a nonvolatile memory device comprises receiving program data, counting frequencies of logic states in the received program data, selecting adjusted margins to be applied to programmed memory cells based on the counted frequencies, and programming the program data in selected memory cells using the adjusted margins.

In certain embodiments, selecting the adjusted margins comprises selecting a first margin for a first logic state having a first counted frequency, and selecting a second margin larger than the first margin for a second logic state having a second counted frequency larger than the first counted frequency.

In certain embodiments, the method further comprises storing supplemental data in the selected memory cells to indicate the adjusted margins used to program the program data.

In certain embodiments, the method further comprises reading the program data from the selected memory cells based on the adjusted margins indicated by the supplemental data.

In certain embodiments, the selecting the adjusted margins comprises selecting levels of verify voltages to be used during the programming the program data.

According to still another embodiment of the inventive concept, a nonvolatile memory system comprises a nonvolatile memory device comprising a plurality of multi-bit memory cells configured to store program data using a plurality of program states, and a controller configured to receive program data to be programmed in the memory cells, detect logic states contained in the program data, select adjusted margins to be applied to programmed memory cells based on the absence of one or more logic states in the detected logic states, and store the program data in selected memory cells using the adjusted margins.

In certain embodiments, the program states correspond to distinct threshold voltage distributions.

In certain embodiments, the program states correspond to distinct resistance distributions.

In certain embodiments, the nonvolatile memory device and controller are incorporated in a solid state drive.

BRIEF DESCRIPTION OF THE DRAWINGS

Embodiments of the inventive concept are described below with reference to the accompanying drawings. In the drawings like reference numbers indicate like features.

DETAILED DESCRIPTION OF THE EMBODIMENTS

Embodiments of the inventive concept are described below with reference to the accompanying drawings. These embodiments are presented as teaching examples and should not be construed to limit the scope of the inventive concept.

Figure 1:
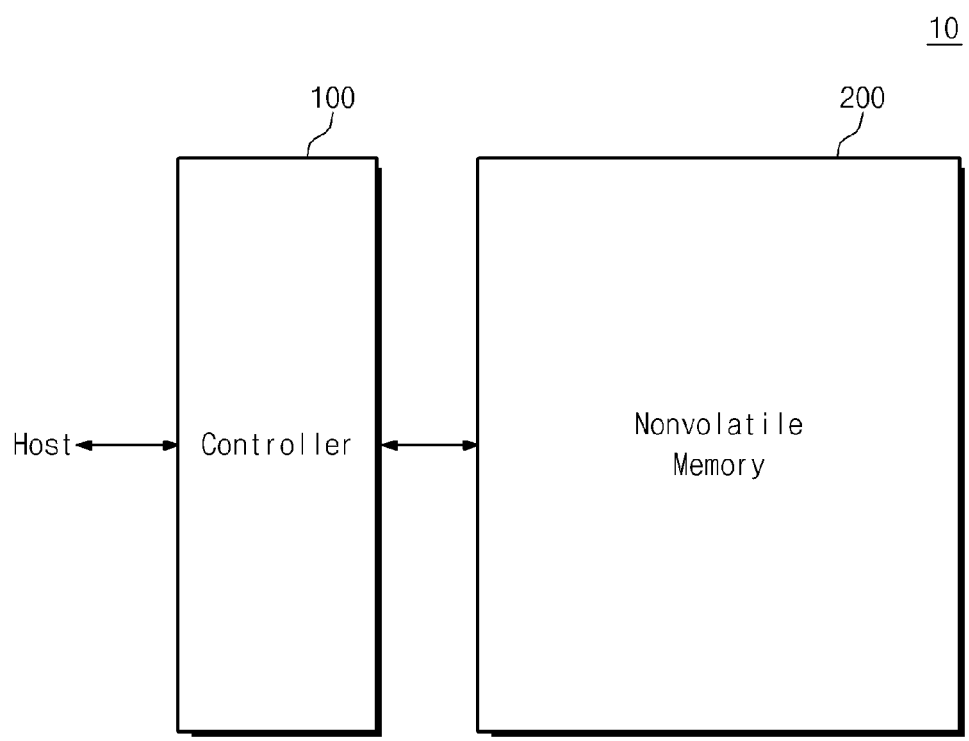
FIG. 1 is a block diagram illustrating a memory system according to an embodiment of the inventive concept.

FIG. 1 is a block diagram illustrating a memory system 10 according to an embodiment of the inventive concept.

Referring to FIG. 1, memory system 10 comprises a controller 100 and a nonvolatile memory device 200.

Controller 100 is connected between a host and nonvolatile memory device 200. Controller 100 is configured to access nonvolatile memory device 200 in response to requests from the host. For example, controller 100 typically controls read, write and erase operations of nonvolatile memory device 200 in response to requests from the host. Controller 100 is also configured to provide an interface between nonvolatile memory device 200 and the host. In some embodiments, controller 100 comprises firmware for controlling nonvolatile memory device 200. An embodiment of controller 100 is described below with reference to FIG. 2.

Nonvolatile memory device 200 is configured to store data under the control of controller 100. Nonvolatile memory device 200 is also configured to output stored data under the control of controller 100. Nonvolatile memory device 200 typically comprises at least one of a ROM, PROM, EPROM, EEPROM, flash memory, PRAM, MRAM, RRAM, and FRAM. An embodiment of nonvolatile memory device 200 is described below with reference to FIG. 3.

In some embodiments, controller 100 and nonvolatile memory device 200 are integrated into one semiconductor device. For example, controller 100 and nonvolatile memory device 200 can be integrated into one semiconductor device to form a memory card, a PC card (e.g., PCMCIA), a compact flash card (CF), a smart media card (e.g., SM and SMC), a memory stick, a multimedia card (e.g., MMC, RS-MMC and MMCmicro), a SD card (e.g., SD, miniSD, microSD, and SDHC), or a universal flash storage (UFS) device.

In some embodiments, controller 100 and nonvolatile memory device 200 are integrated into one semiconductor device to form an SSD. Where memory system 10 is used to form a SSD, the operating speed of the host connected to memory system 10 may increase significantly.

Memory system 10 can be incorporated into an electronic device such as a computer, mobile computer, ultra mobile personal computer (UMPC), work station, net-book, personal digital assistant (PDA), portable computer, web tablet, wireless phone, mobile phone, smart phone, digital camera, digital audio recorder, digital audio player, digital picture recorder, digital picture player, digital video recorder, digital video player, wireless device, home network device, general networking device, telematics network device, a radio frequency identification (RFID) device, or any of various components in a computing system.

Nonvolatile memory device 200 and memory system 10 can be mounted in any of various package types, such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), and wafer-level processed stack package (WSP).

Figure 2:
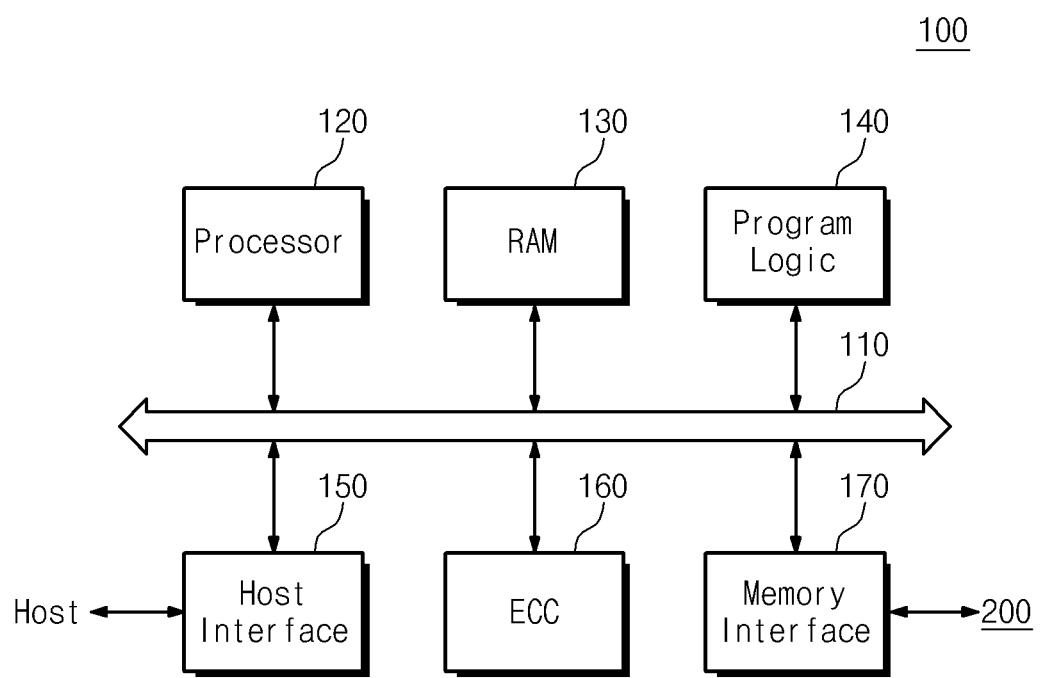
FIG. 2 is a block diagram illustrating an embodiment of a controller shown in FIG. 1.

FIG. 2 is a block diagram illustrating an embodiment of controller 100 shown in FIG. 1.

In the embodiment of FIG. 2, controller 100 comprises a system bus 110, a processor 120, a random access memory (RAM) 130, program logic 140, a host interface 150, an error correction code (ECC) unit 160, and a memory interface 170.

System bus 110 provides a communication channel between the components of controller 100.

Processor 120 communicates with the components of controller 100 through system bus 110 and controls the overall operation of controller 100. In certain embodiments, processor 120 controls the operation of controller 100 by driving firmware. Such firmware could be used, for instance, to control the operation of nonvolatile memory device 200.

RAM 130 is connected to system bus 110 and is used as a working memory of controller 100. In certain embodiments, processor 120 uses RAM 130 as a buffer memory to drive the firmware. In some embodiments, RAM 130 is used as a buffer memory between the host and nonvolatile memory device 200.

RAM 130 typically comprises a volatile RAM such as an SRAM, a DRAM, or a synchronous DRAM (SDRAM), or a nonvolatile RAM such as a NOR flash memory, a phase-change RAM (PRAM), a magnetic RAM (MRAM), a resistive RAM (RRAM) or a ferroelectric RAM (FRAM).

Program logic 140 is connected to system bus 110 and controls program and read operations of nonvolatile memory device 200. In various alternative embodiments, program logic 140 can comprise software driven by processor 120, an analog circuit, a digital circuit, a combination of an analog circuit and a digital circuit, or a combination of software and hardware. The program and read operations performed by program logic 140 are described below in further detail with reference to FIGS. 4 through 14.

Host interface 150 is also connected to system bus 110. Host interface 150 implements a protocol for performing data exchange between the host and controller 100. In various alternative embodiments, host interface 150 can be configured to communicate with an external device (e.g., the host) through one of various interface protocols such as universal serial bus (USB), multimedia card (MMC), peripheral component interface (PCI), PCI-Express (PCI-E), advanced technology attachment (ATA), serial-ATA, parallel-ATA, small computer small interface (SCSI), enhanced small disk interface (ESDI), and integrated drive electronics (IDE).

ECC unit 160 is connected to system bus 110 and is configured to detect and/or correct errors in data read from nonvolatile memory device 200. ECC unit 160 uses error correction codes to detect and correct the errors. Examples of such codes include cyclic redundancy check (CRC) codes, Bose, Chaudhuri, and Hocquenghem (BCH) codes, and a Reed-Solomon (RS) codes.

Memory interface 170 is connected to system bus 110. Memory interface 170 implements a protocol for communication with nonvolatile memory device 200. As an example, memory interface 170 can implement a NAND protocol.

Figure 3:
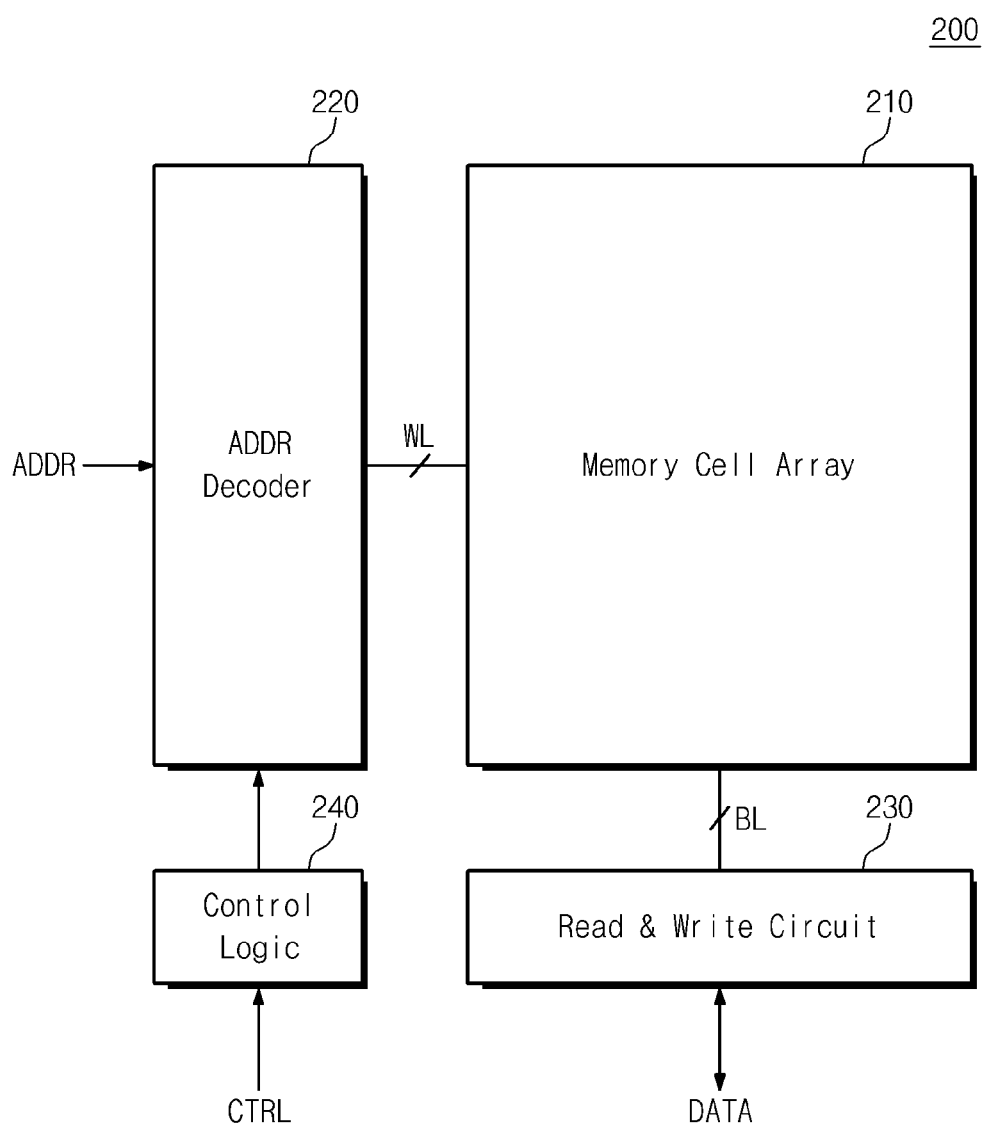
FIG. 3 is a block diagram illustrating an embodiment of a nonvolatile memory device shown in FIG. 1.

FIG. 3 is a block diagram illustrating an embodiment of nonvolatile memory device 200 shown in FIG. 1.

Referring to FIG. 3, nonvolatile memory device 200 comprises a memory cell array 210, an address decoder 220, a read/write circuit 230, and control logic 240.

Memory cell array 210 is connected to address decoder 220 via wordlines WL and is connected to read/write circuit 230 via bitlines BL. Memory cell array 210 comprises a plurality of memory cells arranged in rows and columns, where each row is connected to a corresponding one of wordlines WL, and each column is connected to a corresponding one of bitlines BL. The memory cells are configured to store one or more bits per cell. In certain embodiments, the memory cells store at least three bits per cell.

Address decoder 220 is connected to memory cell array 210 via wordlines WL. Address decoder 220 operates under the control of control logic 240. Address decoder 220 receives an address ADDR from an external source, such as controller 100 of FIG. 1.

Address decoder 220 decodes a row address from address ADDR to select one or more of wordlines WL. Address decoder 220 also decodes a column address from address ADDR and transfers the column address to read/write circuit 230. Address decoder 220 typically comprises a row decoder, a column decoder, and an address buffer.

Read/write circuit 230 is connected to memory cell array 210 via bitlines BL. Read/write circuit 230 exchanges data with an external device. For example, in some embodiments, read/write circuit 230 exchanges data with controller 100 of FIG. 1. Read/write circuit 230 operates under the control of control logic 240 and receives the decoded column address from address decoder 220 to select bitlines BL.

Read/write circuit 230 receives data from an external device and stores the received data in memory cell array 210. Read/write circuit 230 also reads data from memory cell array 210 and outputs the read data to an external device. Read/write circuit 230 also typically reads data from a first storage region of memory cell array 210 and writes the read data in a second storage region of memory cell array 210 in a copy-back operation.

In some embodiments, read/write circuit 230 comprises a page buffer, a column selection circuit, and a data buffer. In some other embodiments, read/write circuit 230 comprises a sense amplifier, a write driver, a column selection circuit, and a data buffer.

Control logic 240 is connected to address decoder 220 and read/write circuit 230. Control logic 240 controls the overall operation of nonvolatile memory device 200. Control logic 240 operates in response to a control signal CTRL received from an external device, such as controller 100 of FIG. 1.

Figure 4:
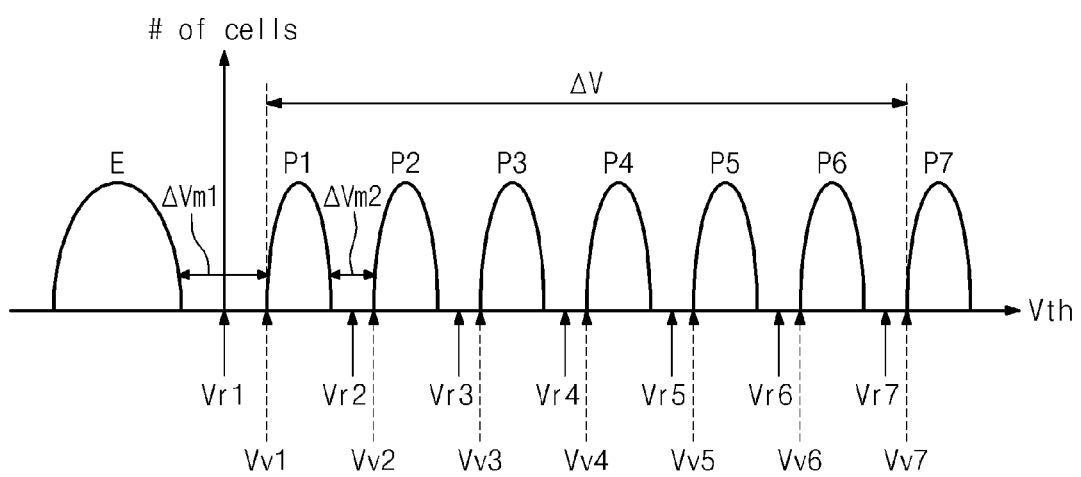
FIGS. 4 through 6 are threshold voltage diagrams illustrating various example program states of memory cells of the nonvolatile memory device of FIG. 3.

FIG. 4 is a threshold voltage diagram illustrating example program states of the memory cells of nonvolatile memory device 200 of FIG. 3.

In FIG. 4 and the other threshold voltage diagrams included in the drawings, the x-axis represents threshold voltages of flash memory cells and the y-axis represents the number of memory cells having each threshold voltage. The threshold voltages of different memory cells are grouped in different threshold voltage distributions corresponding to a different logic states. For instance, in FIG. 4, there are eight different threshold voltage distributions corresponding to eight different logic states. These eight threshold voltage distributions correspond to an erased state "E", and program states P1 through P7.

In the description that follows, erase state E and program states P1 through P7 are referred to as program states, and a bit value or set of bit values are referred to as logic states. In general, logic states can be mapped to program states in a variety of ways. As one example, in FIG. 4 eight program states are mapped to eight respective logic states comprising three bit values "111", "110", "100", "101", "001", "011", "010", and "000". In other words, each program state corresponding to a particular threshold voltage distribution is assigned to a logic state corresponding to a set of bit values.

Although the embodiment of FIG. 4, as well as other illustrated embodiments, uses three bit logic states, the inventive concept is not limited to memory cells storing three bits. Rather, alternative embodiments can comprise memory cells storing fewer or more than three bits. Additionally, although the embodiment of FIG. 4, as well as other illustrated embodiments, relates to flash memories, the inventive concept is not limited to flash memories. Rather, alternative embodiments can comprise other forms of memory, such as MRAM, RAM, PRAM and RRAM. In some alternative embodiments, logic states can be represented by parameters other than threshold voltages. For instance, in some embodiments, variable resistance values can be used to define program states instead of threshold voltages, and the variable resistances can be used to distinguish between different program states.

Referring to FIGS. 1 through 4, each of the memory cells of memory cell array 210 stores three bits using one of eight program states. The eight program states comprise erase state E and first through seventh program states P1 through P7.

Program data is transferred from controller 100 to nonvolatile memory device 200. A program operation of nonvolatile memory device 200 is controlled by program logic 140. Control logic 240 controls read/write circuit 230 in response to control signal CTRL received from program logic 140.

The program operation increases the threshold voltages of selected memory cells. In one embodiment, this is accomplished by applying a program voltage to a selected wordline connected respective control gates of the selected memory cells while applying appropriate voltages to selected bitlines based on data values to be stored in the selected memory cells. The voltages applied to the selected wordline and bitlines cause the memory cells to store charges in their floating gates, which increases their threshold voltages.

In the embodiment of FIG. 4, a first verify voltage Vv1 is used to program memory cells to first program state P1. Memory cells that are turned on in response to receiving first verify voltage Vv1 on their respective control gates are determined to have a threshold voltage lower than first verify voltage Vv1. Where a memory cell has a threshold voltage lower than a target threshold voltage, the memory cell is determined to be program-failed. Memory cells that are turned off in response to receiving first verify voltage Vv1 on their respective control gates are determined to have threshold voltages higher than first verify voltage Vv1. Where a memory cell has a threshold voltage higher than a target threshold voltage, the memory cell is determined to be program-passed.

A program operation can be repeated until all selected memory cells are program-passed. The program operation can be repeated with an incremental increase in the program voltage, as in an incremental step pulse program (ISPP) operation.

Second through seventh verify voltages Vv2 through Vv7 can be used to program the memory cells to second through seventh program states P2 through P7.

Read operations of nonvolatile memory device 200 are controlled by program logic 140. Control logic 240 controls read/write circuit 230 in response to control signal CTRL generated by program logic 140.

A first read voltage Vr1 has a voltage level between erase state E and first program state P1. Where first read voltage Vr1 is applied to the respective control gates of selected memory cells, selected memory cells in erase state E are turned on and selected memory cells in first through seventh program states P1 through P7 are turned off.

To allow different threshold voltage distributions to be reliably distinguished from each other, threshold voltage distributions are separated by sensing margins, and read voltages are located within the sensing margin. A sensing margin (or simply "margin") is the distance between adjacent threshold voltage distributions.

In the example of FIG. 4, erase state E and first program state P1 are separated by a sensing margin $\Delta Vm1$ (also referred to as first voltage range $\Delta Vm1$) and first read voltage Vr1 is located within the sensing margin. Similarly, each of second through seventh read voltages Vr2 through Vr7 has a voltage level between the first through seventh program states P1 through P7. Accordingly, selected memory cells that are turned off in response to first read voltage Vr1 and turned on in response to second read voltage Vr2 are determined to be in first program state P1. The remaining program states P2 through P7 can be similarly detected using second through seventh read voltages Vr1 through Vr7. As indicated by FIG. 4, program states P1 through P7 are each separated by sensing margins of approximately a second voltage range $\Delta Vm2$.

In the description that follows, program states that are programmed using one of verify voltages Vv1 through Vv7 are referred to as being normal-programmed.

Figure 5:
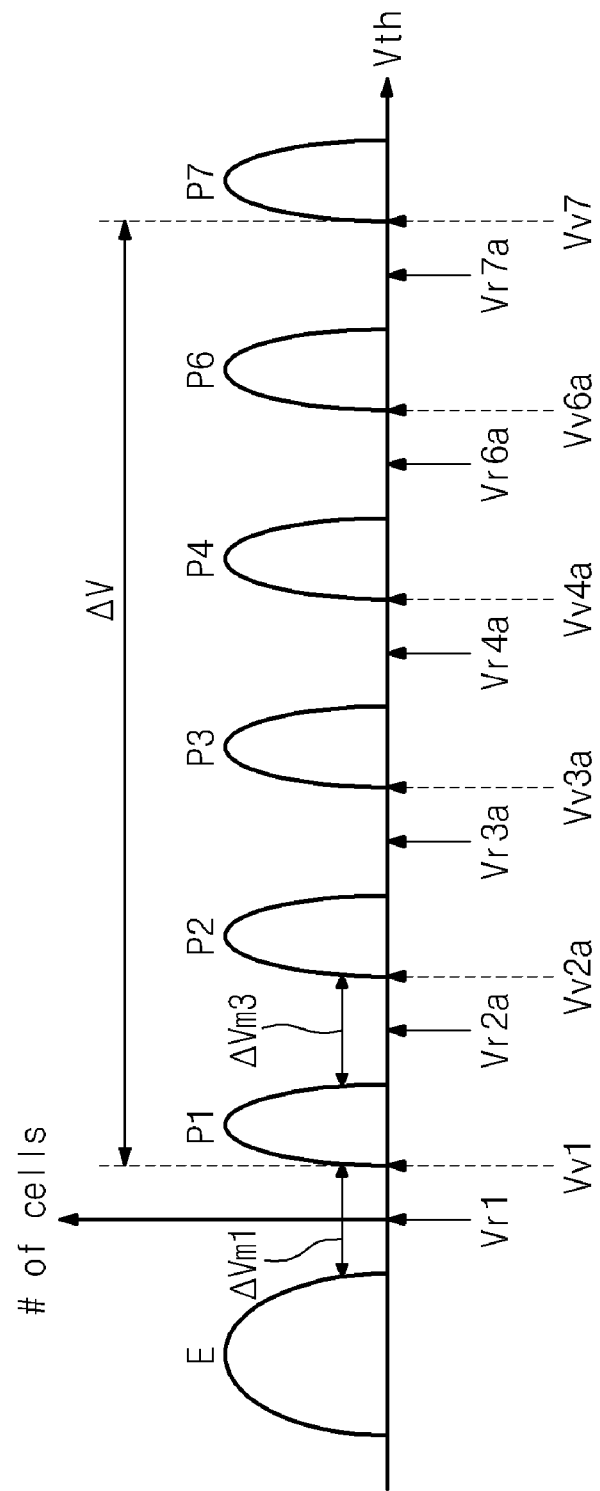

FIG. 5 is a threshold voltage diagram illustrating example program states of the memory cells of nonvolatile memory device 200 of FIG. 3.

Referring to FIGS. 1 through 3 and FIG. 5, selected memory cells are programmed to erase state E, first through fourth program states P1 through P4, and sixth and seventh program states P6 and P7. In the embodiment of FIG. 5, the selected memory cells are not programmed to fifth program state P5, as indicated by the omission of this state in the threshold voltage diagram. Because program state P5 is not used in the embodiment of FIG. 5, the margins of logic states E, P1 through P4, P6 and P7 are adjusted accordingly. In particular, the margins of program states P1, P2, P3, P4 and P6 within a voltage range $\Delta V$ are adjusted to a third voltage range $\Delta Vm3$.

As described with reference to FIG. 4, first program state P1 is normal-programmed using first verify voltage Vv1 and seventh program state P7 is normal-programmed using seventh verify voltage Vv7. The second through fourth program states P2 through P4 and sixth program state P6 are normal-programmed using varied verify voltages Vv2a, Vv3a, Vv4a and Vv6a.

Varied verify voltages Vv2a, Vv3a, Vv4a and Vv6a are set to equalize the margins of program states P1, P2, P3, P4 and P6 in voltage range $\Delta V$ to third voltage range $\Delta Vm3$. In other words, the verify voltages for programming logic states P2 through P4 and P6 in voltage range $\Delta V$ are varied relative to the values of verify voltages Vv2 through Vv4 and Vv6 in FIG. 4.

First read voltage Vr1 and varied read voltages Vr2a, Vr3a, Vr4a, Vr6a and Vr7a are used to read the memory cells. As illustrated in FIG. 5, the margins of program states P1, P2, P3, P4 and P6 in voltage range $\Delta V$ are equalized to third voltage range $\Delta Vm3$. Third voltage range $\Delta Vm3$ is larger than second voltage range $\Delta Vm2$. That is, when compared to the program states of FIG. 4, the program states of FIG. 5 have larger sensing margins. Thus, the reliability of nonvolatile memory device 200 is improved.

Sixth read voltage Vr6 of FIG. 4 has the same level as varied sixth verify voltage Vv6a, and second through fifth read voltages Vr2 through Vr5 of FIG. 4 have the same levels as respective second through fifth varied verify voltages Vv2a through Vv5a. Accordingly, the same voltage generation circuit can be used to generate certain voltages for the embodiments of both FIGS. 4 and 5, which can simplify the structure of the voltage generation circuit.

Selected memory cells can be programmed using the embodiment of FIG. 5 where the program data does not use fifth program state P5. Accordingly, the margins of the program states in voltage range $\Delta V$ can be improved to third voltage range $\Delta Vm3$ where the program data does not use fifth program state P5.

Figure 6:
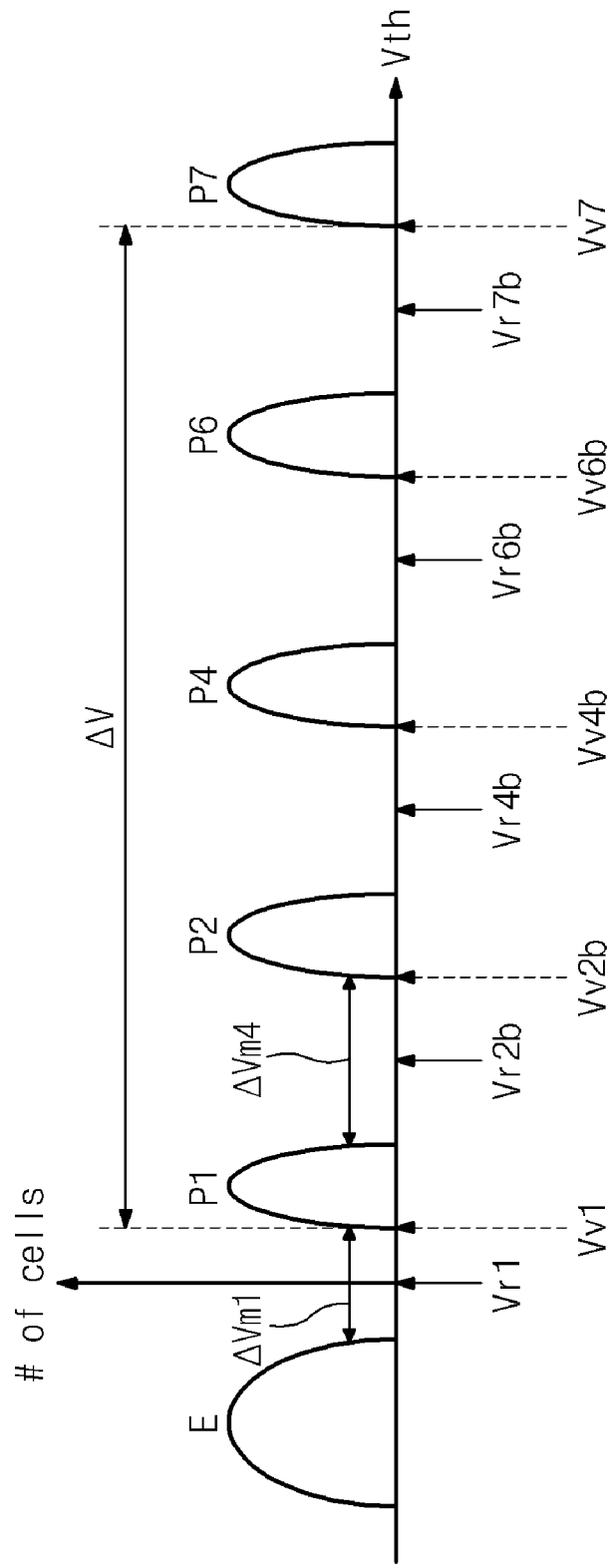

FIG. 6 is a diagram illustrating example program states of the memory cells of nonvolatile memory device 200 of FIG. 3.

In the embodiment of FIG. 6, selected memory cells are programmed to erase state E and first, second, fourth, sixth and seventh program states P1, P2, P4, P6 and P7. This embodiment can be used where program data to be programmed in selected memory cells does not require the use of third and fifth program states P3 and P5. Where program states P3 and P5 are not used, the margins of program states E, P1, P2, P4, P6 and P7 are selectively varied. In particular, the margins of program states P1, P2, P4 and P6 in voltage range $\Delta V$ are controlled to be equalized to a fourth voltage range $\Delta Vm4$.

As described with reference to FIG. 4, first program state P1 is programmed using first verify voltage Vv1, and seventh program state P7 is programmed using seventh verify voltage Vv7. Second, fourth and sixth program states P2, P4 and P6 are programmed using varied verify voltages Vv2b, Vv4b and Vv6b. Varied verify voltages Vv2b, Vv4b and Vv6b are set to substantially equalize the margins of the program states P1, P2, P4 and P6 in voltage range $\Delta V$ to fourth voltage range $\Delta Vm4$. In other words, the verify voltages for programming program states P2, P4 and P6 in voltage range $\Delta V$ are varied to equalize the margins of the program states P1, P2, P4 and P6 in voltage range $\Delta V$.

First read voltage Vr1 and varied read voltages Vr2b, Vr4b, Vr6b and Vr7b are used to read selected memory cells. As illustrated in FIG. 6, the margins of program states P1, P2, P4 and P6 in voltage range $\Delta V$ are equalized to fourth voltage range $\Delta Vm4$. Fourth voltage range $\Delta Vm4$ is larger than second and third voltage ranges $\Delta Vm2$ and $\Delta Vm3$. In other words, in comparison with program states described with reference to FIGS. 4 and 5, the margins of selected memory cells programmed with program data not using third or fifth program states P3 or P5 is improved. Thus, the reliability of nonvolatile memory device 200 is improved.

Fourth verify voltage Vv4 of FIG. 4 can have the same level as varied fourth verify voltage Vv4b of FIG. 6, and varied sixth read voltage Vr6a of FIG. 5 can have the same level to varied sixth verify voltage Vv6b of FIG. 6. Accordingly, the same voltage generation circuit can be used to generate the corresponding voltages. Thus, the structure of a voltage generation circuit can be simplified.

As indicated by the above description, FIG. 6 illustrates an example where program data does not use third or fifth program states P3 or P5. In this example, the margins of program states are improved by adjusting read and verify voltages.

Figure 7:
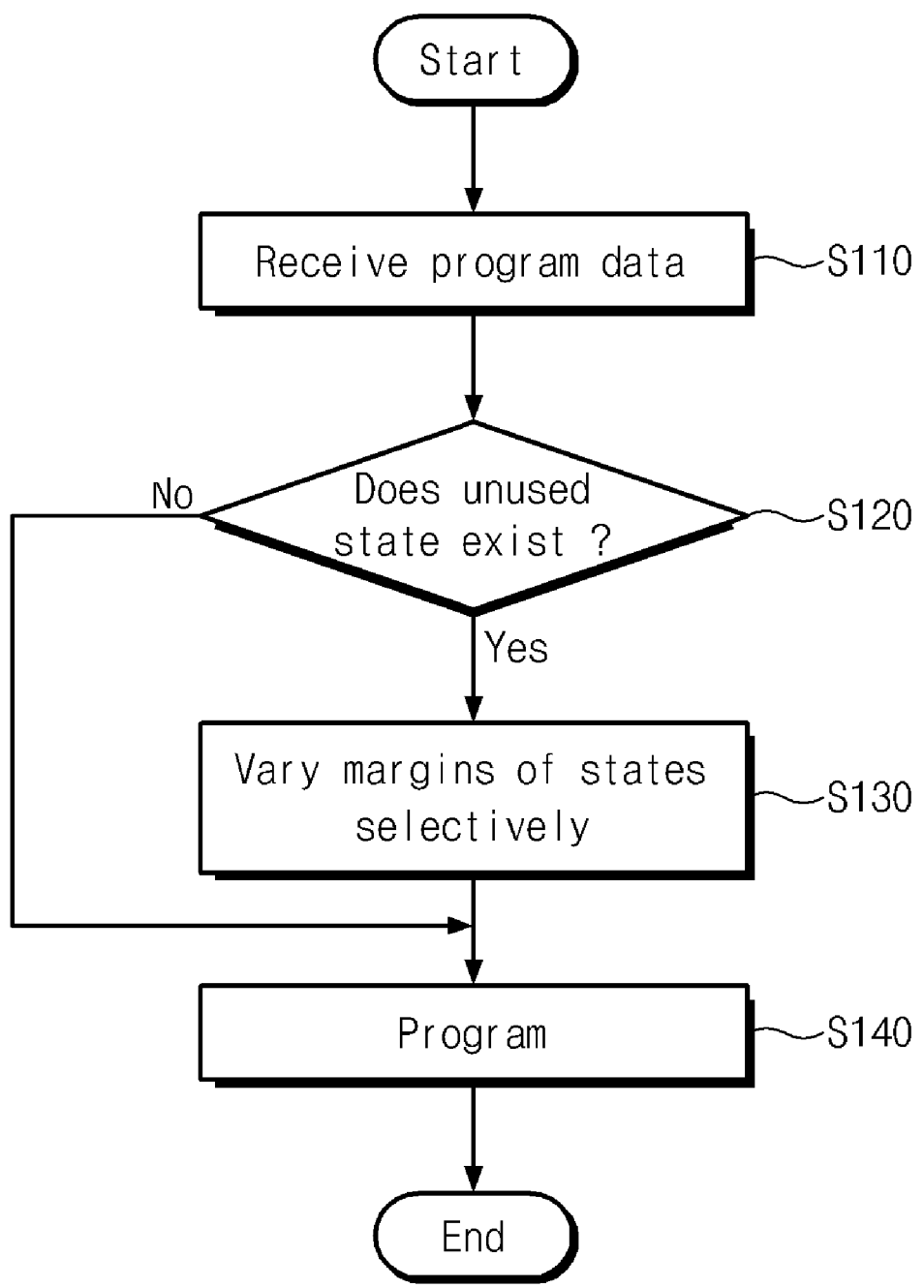
FIG. 7 is a flowchart illustrating a method of operating program logic illustrated in FIG. 2 to perform program operations described with reference to FIGS. 4 through 6.

FIG. 7 is a flowchart illustrating a method of operating program logic 140 of FIG. 2 to perform program operations described with reference to FIGS. 4 through 6. In the description that follows, example method steps are indicated by parentheses (SXXX).

Referring to FIGS. 2 and 7, program logic 140 receives program data (S110). The program data is typically received from the host.

Next, program logic 140 determines whether the program data has any unused logic state (S120). Program logic 140 typically makes this determination by analyzing the received program data. Where the memory cells of nonvolatile memory device 200 are configured to store 3 bits, each of the memory cells is typically configured to have one of 8 program states. Program logic 140 can compare the number of program states available to the memory cells and the number of logic states in the program data. Where the number of program states available to the memory cells is greater than the number of logic states in the program data, it is determined that the program data has an unused logic state. Where there is no unused logic state (S120=No), program logic 140 controls nonvolatile memory device 200 to perform a normal program operation (S140). Where there is an unused logic state (S120=Yes), program logic 140 controls nonvolatile memory device 140 to perform a program operation with varied margins (S130). For example, program logic 140 can control the margins of the program states to be equalized. Where the program data includes seven logic states, the margins of the program states can be varied as in FIG. 5, or where the program data includes six logic states, the margins of the logic states can be varied as in FIG. 6.

Program logic 140 can vary the margins by selecting one of various sets of predetermined verify voltages. The sets of predetermined verify voltages can comprise, for example, a set of verify voltages for program data where one logic state is unused, a set of verify voltages for program data where two logic states are unused, and a set of verify voltages for program data where three logic states are unused.

Program logic 140 can also select one of various sets of predetermined verify voltages and program voltages. The sets of predetermined verify voltages and program voltages can comprise, for instance, a set of verify voltages and program voltages for program data where one logic state is unused, and a set of verify voltages and program voltages for program data where two logic states are unused.

A program operation is performed after program logic 140 selects a set of verify voltages and program voltages (S140). In the program operation, the program data is provided to nonvolatile memory device 200 and program logic 140 controls nonvolatile memory device 200 to perform a program operation using the varied margins. In some embodiments, program logic 140 controls nonvolatile memory device 200 by providing a margin varying program command to nonvolatile memory device 200. In some embodiments, program logic 140 controls nonvolatile memory device 200 by providing a verify voltage set selection signal or a verify voltage and program voltage set selection signal to nonvolatile memory device 200.

Nonvolatile memory device 200 generates voltages corresponding to a set of selected verify voltages or a set of selected verify voltages and program voltages, under the control of program logic 140. The generated voltages are used to perform a program operation.

In the program operation, supplemental data can be written together with the program data to indicate the varying of the margins of the logic states of the program data. The supplemental data can comprise, for instance, information about the type and number of unused logic states. The supplemental data can be generated by program logic 140.

In a read operation, read voltages can be selected with reference to the supplemental data. For example, one of the sets of read voltages can be selected with reference to the supplemental data. The sets of read voltages can comprise, for instance, a set of read voltages for stored data where one logic state is unused, a set of read voltages for stored data where two logic states are unused, and a set of read voltages for stored data where three logic states are unused.

Program logic 140 can determine the read data in response to the read supplemental data. For example, program logic 140 can determine the read data on the basis of information about unused logic states.

As indicated by the above description, where at least one of the logic states of selected memory cells is unused by program data, the margins of the logic states are selectively varied. In some embodiments, as illustrated by FIGS. 4 through 6, the margins of logic states in a voltage range $\Delta V$ are equalized. Thus, the margins of the logic states are improved and the reliability of nonvolatile memory device 200 is improved.

Although the embodiments of FIGS. 4 through 7 relate to memory cells storing 3 bits of data, the inventive concept is not limited to 3-bit memory cells. In alternative embodiments, for instance, nonvolatile memory device 200 can comprise memory cells storing two or more bits each. In addition, although the above-described embodiments relate to memory cells that store data using variable threshold voltages, other embodiments can use memory cells that store data by variable resistance values or other parameters.

Figure 8:
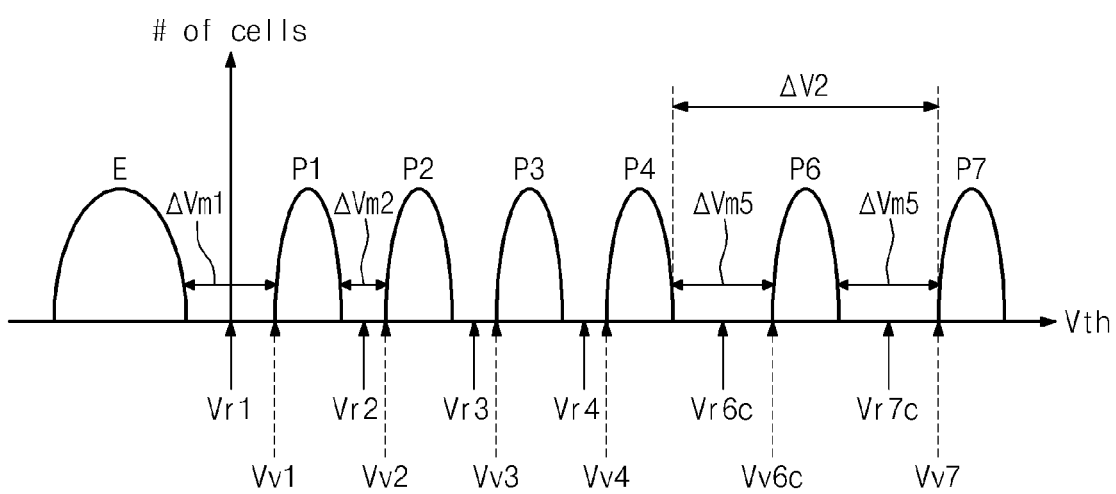
FIG. 8 is a threshold voltage diagram illustrating example program states of memory cells of the nonvolatile memory device of FIG. 3.

FIG. 8 is a threshold voltage diagram illustrating example program states of memory cells of nonvolatile memory device 200 of FIG. 3. In this example, it is assumed that the program data for selected memory cells does not require the use of fifth program state P5.

The example of FIG. 8 is based on the phenomenon that charge loss in memory cells, and therefore read error rate, can increase with increasing threshold voltages. To prevent such read errors from occurring, program logic 140 can selectively vary the margins of logic states having high threshold voltages.

Referring to FIGS. 1 through 3 and FIG. 8, first through fourth program states P1 through P4 are normal-programmed using first through fourth verify voltages Vv1 through Vv4. Seventh program state P7 is normal-programmed using seventh verify voltage Vv7. Sixth program state P6 is programmed using varied sixth verify voltage Vv6c. First through fourth read voltages Vr1 through Vr4 and varied sixth and seventh read voltages Vr6c and Vr7c are used to read the memory cells.

Erase state E corresponds to first voltage range $\Delta Vm1$. The margins of first through third program states P1 through P3 correspond to second voltage range $\Delta Vm2$. The margins of fourth and sixth program states P4 and P6 correspond to fifth voltage range $\Delta Vm5$. Fifth voltage range $\Delta Vm5$ is larger than second voltage range $\Delta Vm2$.

Where there is an unused logic state, the margins of program states P1 through P3 with lower threshold voltages are maintained and the margins of the program states P4 and P6 with higher threshold voltages are varied. Where one of the program states in voltage range $\Delta V2$ is unused, the margins of the program states are selectively varied. For example, the margins of the program states P4 and P6 in voltage range $\Delta V2$ are equalized.

Figure 9:
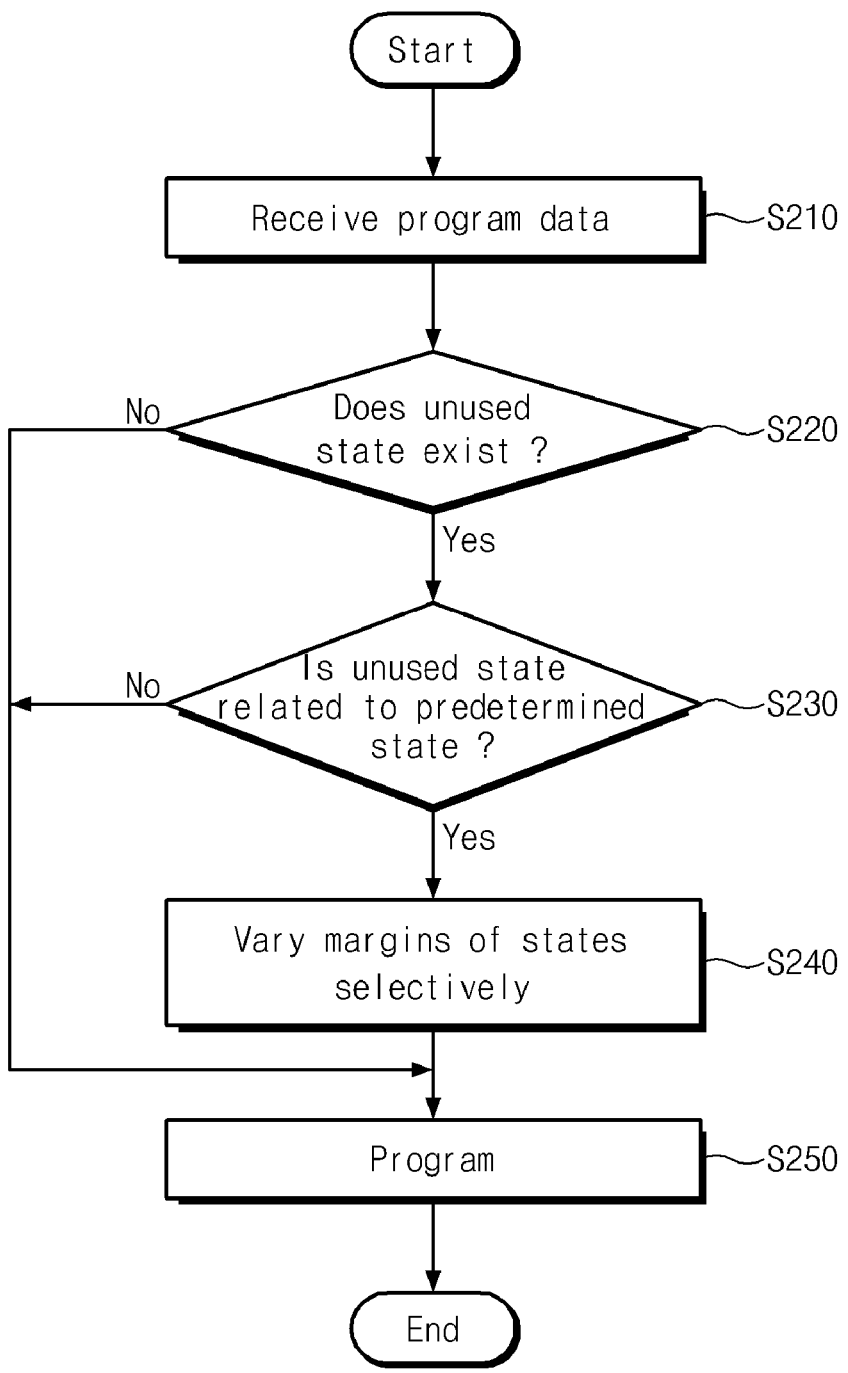
FIG. 9 is a flowchart illustrating a method of operating the program logic of FIG. 2 to perform a program operation described with reference to FIG. 8.

FIG. 9 is a flowchart illustrating a method of operating program logic 140 of FIG. 2 to perform a program operation described with reference to FIG. 8.

Referring to FIGS. 2 and 9, program logic 140 receives program data (S210). The program data can be received, for instance, from the host.

Program logic 140 then determined whether the program data includes an unused logic state (S220). Program logic 140 typically makes this determination by analyzing the received program data. Where the memory cells of nonvolatile memory device 200 store 3 bits, each of the memory cells typically uses 8 program states to store the 3 bits. Program logic 140 can analyze the program data by comparing the number of program states available to the memory cells with the number of logic states in the program data. Where the number of program states available to the memory cells is larger than the number of logic states in the program data, program logic 140 determines that there is an unused logic state. Where there is no unused logic state (S220=No), a normal program operation is performed (S250). Otherwise, where there is an unused logic state (S220=Yes), program logic 140 determines whether the unused logic state is related to the predetermined logic states (S250).

For example, program logic 140 can determine whether the logic value of the unused logic state is higher than a predetermined value, or whether the unused logic state corresponds to a program state within voltage range $\Delta V2$, such as fourth through sixth program states P4 through P6. Where the unused logic state is not related to the predetermined logic states (S230=No), a normal program operation is performed (S250). Otherwise (S230=Yes), the margins of the program states are selectively varied (S240). For example, program logic 140 can control the margins of the program states in voltage range $\Delta V2$ to be equalized to a fifth voltage range $\Delta Vm5$ illustrated in FIG. 8. Where fifth program state P5 is unused, the margins of the program states can be varied as described with reference to FIG. 8.

As described with reference to FIG. 8, the margins of the program states can be varied by adjusting the verify voltages for programming the memory cells. The margins of the program states can also be varied by adjusting the verify voltages and the program voltages. In various embodiments, program logic 140 can be configured to select one of the sets of predetermined verify voltages. For instance, program logic 140 can be configured to select one of the sets of predetermined verify voltages and program voltages.

After the verify voltages and/or program voltages are varied, a program operation is performed (S250). In the program operation, program data is provided to nonvolatile memory device 200, and program logic 140 controls nonvolatile memory device 200 to program selected memory cells using the varied margins. Program logic 140 can control the variation of the margins, for instance, by issuing a margin varying program command to nonvolatile memory device 200, or providing a verify voltage set selection signal or a verify voltage and program voltage set selection signal to nonvolatile memory device 200.

Nonvolatile memory device 200 can generate voltages corresponding to a set of selected verify voltages or a set of selected verify voltages and program voltages, under the control of program logic 140. The generated voltages can be used to perform a program operation.

In the program operation of FIG. 9, supplemental data can be written to selected memory cells together with the program data. The supplemental data can include information about the varying of the margins of the program states of the program data. The supplemental data typically comprises information about the type and number of unused logic states in the program data and is generated by program logic 140.

In a read operation, read voltages can be selected with reference to the supplemental data. For example, one set of read voltages can be selected with reference to the supplemental data. The set of read voltages can comprise, for instance, a set of read voltages for program data where one logic state is unused, a set of read voltages for program data where two logic states are unused, and a set of read voltages for program data where three logic states are unused.

Program logic 140 can determine the read data in response to the read supplemental data. For example, program logic 140 can determine the read data on the basis of information about the unused logic state.

As indicated by the above description, where at least one of the logic states that can be programmed in the memory cells is unused and the unused logic state is related to a predetermined program state, the margins of certain program states are selectively varied. For example, the margins of the program states in voltage range $\Delta V2$ can be equalized. That is, the margins of program states with higher charge loss (e.g., program state P4 through P6) are improved.

The program states with lower charge loss (e.g., E and P1 through P3) are normal-programmed. Accordingly, program logic 140 can be simplified, a voltage generation circuit for generating the program voltages and the read voltages can be simplified, and the supplemental data can be simplified. Consequently, the reliability of nonvolatile memory device 200 can be improved and the complexity of memory system 10 can be reduced.

In the embodiment of FIGS. 8 and 9, fifth program state P5 is unused. However, in alternative embodiments, other program states can be unused and the logic states adjusted accordingly. Also in the embodiment of FIGS. 8 and 9, a normal program operation is performed where the program state corresponding to an unused logic state is outside a predetermined range, such as where the program state is not one of program states P4 through P6. However, in alternative embodiments, the margins of the program states can be selectively varied even where the program state corresponding to an unused logic state is outside the predetermined range.

In some alternative embodiments, the mappings between logic states and program states can be changed while maintaining the varied margins of FIG. 8. For instance, suppose program data uses a logic state corresponding to fifth program state P5 but not second program state P2. In this instance, the logic state labeled corresponding to program state P2 in FIG. 8 can be assigned to program state P5 and the logic state corresponding to program state P5 can be reassigned to program state P2 so that the unused logic state corresponds to the omitted program state P5. The supplemental data can also be modified to incorporate information indicating that the second program state P2 and fifth program state P5 have interchanged logic states. In other words, where the unused logic state corresponds to a program state outside a predetermined range, such as the upper range of program states P4 through P6, the unused logic state can be assigned to a different program state within the predetermined range to allow for adequate adjustment of margins.

Although the embodiments of FIGS. 8 and 9 relate to memory cells storing 3 bits of data, the inventive concept is not limited to 3-bit memory cells. In alternative embodiments, for instance, nonvolatile memory device 200 can comprise memory cells storing two or more bits each. In addition, although the above-described embodiments relate to memory cells that store data using variable threshold voltages, other embodiments can use memory cells that store data using variable resistance values or other parameters.

Figure 10:
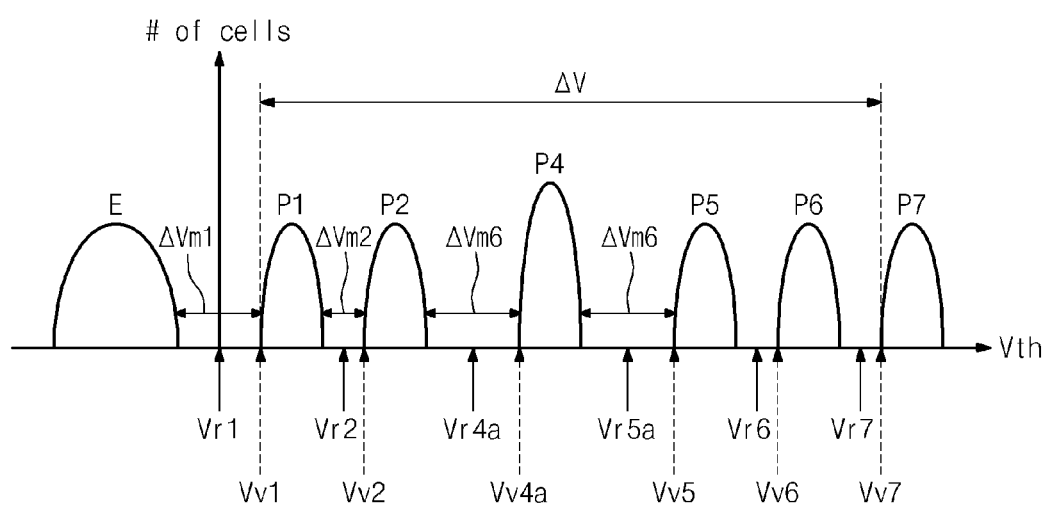
FIG. 10 is a threshold voltage diagram illustrating example program states of memory cells of the nonvolatile memory device of FIG. 3.

FIG. 10 is a threshold voltage diagram illustrating example program states of memory cells of nonvolatile memory device 200 of FIG. 3. In the example of FIG. 10, it is assumed that program data does not use third program state P3.

Referring to FIGS. 1 through 3 and FIG. 10, the program data correspond to erase state E, first and second program states P1 and P2, and fourth through seventh program states P4 through P7. Fourth program state P4 is a most frequent among program states P1, P2 and P4 through P6 in voltage range $\Delta V$.

Sixth program state P6 is programmed using varied sixth verify voltage Vv6c. Varied sixth and seventh read voltages Vr6c and Vr7c are used in a read operation. The margin of program states P1, P5 and P6 is maintained at second voltage range $\Delta Vm2$ and the margins of second and fourth program states P2 and P4 are varied to sixth voltage range $\Delta Vm6$, where sixth voltage range $\Delta Vm6$ is greater than second voltage range $\Delta Vm2$. Consequently, read errors can be reduced because the margin of the most frequent program state is extended.

Figure 11:
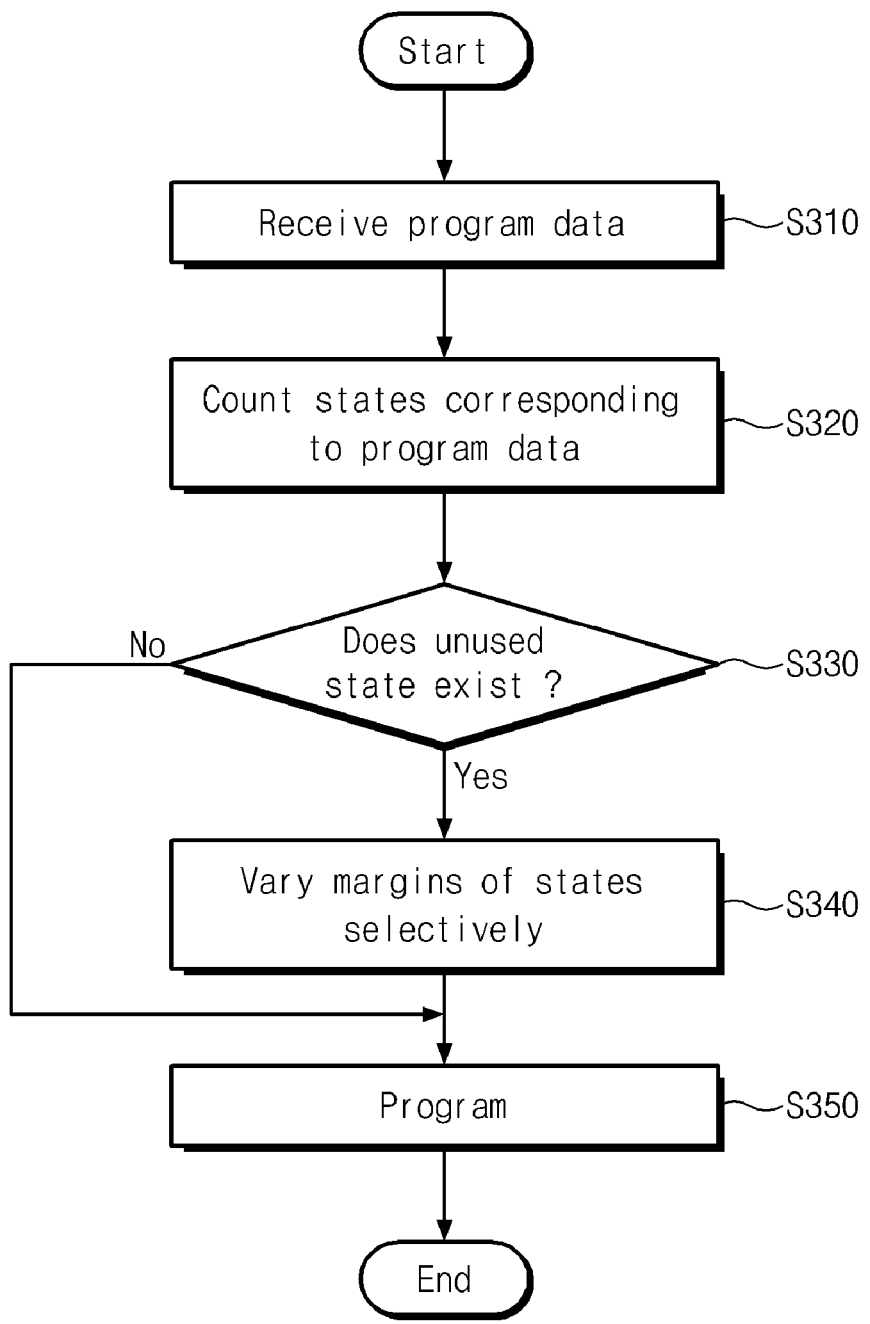
FIG. 11 is a flowchart illustrating a method of operating the program logic of FIG. 2 to perform a program operation described with reference to FIG. 10.

FIG. 11 is a flowchart illustrating a method of operating program logic 140 of FIG. 2 to perform a program operation described with reference to FIG. 10.

Referring to FIGS. 2 and 11, program logic 140 receives program data (S310). The program data is typically received from the host.

Program logic 140 then counts the number of each logic state in the received program data (S320). For example, program logic 140 can count the frequency of logic states corresponding to erase state E and the frequency of each of logic states corresponding to first through seventh program states P1 through P7.

Next, program logic 140 determines whether the program data has an unused logic state (S330). Program logic 140 can determine whether there is an unused logic state based on the count results. For example, where there is a logic state with a count value of 0, the logic state is identified as an unused logic state. Where there is no unused logic state (S330=No), a normal program operation is performed (S350). Otherwise (S330=Yes), the margins of the program states are selectively varied based on the unused logic state (S340). For example, program logic 140 can increase the margin of the program state in voltage range $\Delta V$ that corresponds to the most frequent logic state (hereinafter, the "most frequent program state"), such as program state P4. Program logic 140 can then equalize the margins between the most frequent program state and program states are adjacent to the most frequent program state.

As described with reference to FIG. 10, the margins of the program states can be varied by adjusting corresponding verify voltages. The margins of the program states can also be varied by adjusting the both verify voltages and program voltages. Program logic 140 can perform the adjustments based on a set of predetermined verify voltages or a set of predetermined verify voltages and program voltages.

After the program states are selectively varied, a program operation is performed using the varied program states (S350). In the program operation, program data is provided to nonvolatile memory device 200 and program logic 140 controls nonvolatile memory device 200 to program selected memory cells based on the varied margins. Program logic 140 can perform the program operation with varied margins, for instance, by providing a margin varying program command to nonvolatile memory device 200, or providing a verify voltage set selection signal or a verify voltage and program voltage set selection signal to nonvolatile memory device 200. Alternatively, nonvolatile memory device 200 can generate voltages corresponding to a set of selected verify voltages or a set of selected verify voltages and program voltages, under the control of program logic 140, and the generated voltages can be used to perform a program operation.

In the program operation, supplemental data can be written together with the program data. The supplemental data can include information regarding the varying of the margins of the program states of the selected memory cells. For example, the supplemental data can comprise information about the type and number of unused logic states in the program data and/or the correspondences between the logic states and program states. The supplemental data is typically generated by program logic 140.

In a read operation, read voltages can be selected based on the supplemental data. For example, a set of read voltages can be selected based on the supplemental data. The set of read voltages can comprise, for instance, a set of read voltages for program data where one logic state is unused, a set of read voltages for program data where two logic states are unused, or a set of read voltages for program data where three logic states are unused.

In the embodiments of FIGS. 10 and 11, where at least one of the logic states that can be programmed in selected memory cells is unused, the margins of the corresponding program states are selectively varied. In particular, the margin of the most frequent program state in voltage range $\Delta V$ is increased. Consequently, read errors of the most frequent program state P4 can be reduced.

In the embodiments of FIGS. 10 and 11, less frequent program states, such as states E, P1, P2, P5, P6 and P7 are normal-programmed. Accordingly, program logic 140 can be simplified, a voltage generation circuit for generating the program voltages and the read voltages can be simplified, and the supplemental data can be simplified. In addition, by increasing some of the margins, the reliability of nonvolatile memory device 200 can be improved and the complexity of memory system 10 reduced.

In the embodiment of FIG. 10, third program state P3 is unused. In alternative embodiments, however, other program states can be unused, as in the examples of FIGS. 4 to 6. In addition, in the embodiment of FIG. 10, the margin of the most frequent program state is increased. In other embodiments, the margin can be increased for additional frequently used program states. For instance, where two or more logic states are unused, two or more frequently used program states can have their margins increased. In other words, where two program states are unused, the margins of the first and second most frequent program states in voltage range ΔV can be increased. In certain embodiments, the varied margins of the first and second most frequent program states can be equalized.

Although the embodiments of FIGS. 10 and 11 relate to memory cells storing 3 bits of data, the inventive concept is not limited to 3-bit memory cells. In alternative embodiments, for instance, nonvolatile memory device 200 can comprise memory cells storing two or more bits each. In addition, although the above-described embodiments relate to memory cells that store data using variable threshold voltages, other embodiments can use memory cells that store data using variable resistance values or other parameters.

Figure 12:
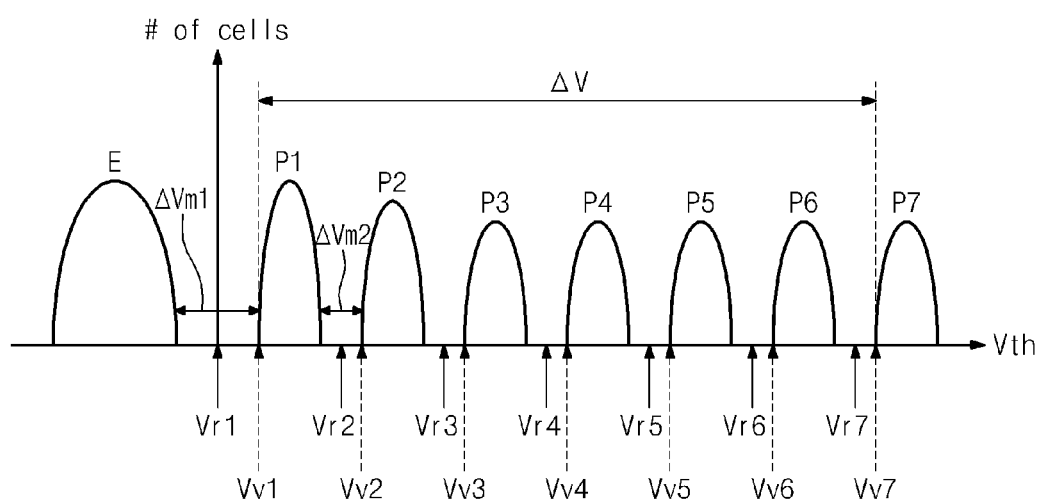
FIG. 12 is a threshold voltage diagram illustrating example program states of memory cells of the nonvolatile memory device of FIG. 3.

FIG. 12 is a threshold voltage diagram illustrating example program states of memory cells of nonvolatile memory device 200 of FIG. 3.

Referring to FIG. 12, erase state E and first through seventh program states P1 through P7 are normal-programmed as described with reference to FIG. 4. However, the most frequent logic state among the logic states is mapped to erase state E, the second most frequent logic state is mapped to first program state P1, and the third most frequent logic state is mapped to second program state P2. By using this mapping, the overall frequency of read errors can be reduced due to the fact that read error tend to be less frequent in memory cells with lower threshold voltages. In addition, mapping information of the logic states can be included in supplemental data. Accordingly, read operations can be performed based on the supplemental data.

Figure 13:
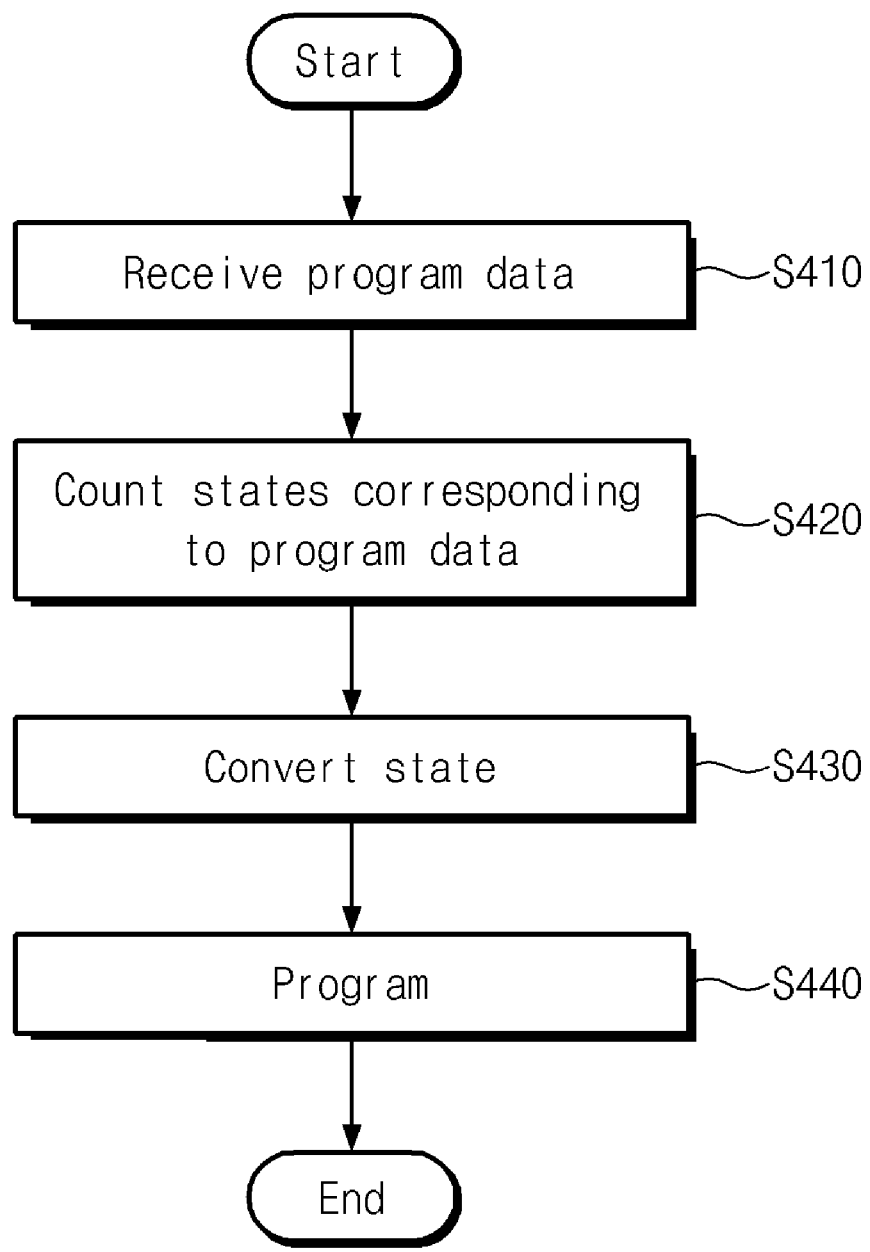
FIG. 13 is a flowchart illustrating a method of operating the program logic of FIG. 2 to perform a program operation described with reference to FIG. 12.

FIG. 13 is a flowchart illustrating a method of operating program logic 140 of FIG. 2 to perform a program operation described with reference to FIG. 12.

Referring to FIGS. 2 and 13, program logic 140 receives program data (S410). The program data is typically received from the host. Program logic 140 then counts the number of instances of each logic state in the program data (S420). For example, program logic 140 can count the frequency of logic states "111", "110", "100", etc.

Based on the respective frequencies of each logic state, the logic states are converted, or mapped onto corresponding program states or threshold voltage distributions (S430). In one example, program logic 140 maps the most frequent logic state to erase state E, maps the second most frequent logic state to first program state P1, and maps the third-most frequent logic state to second program state P2. Similarly, program logic 140 maps logic states to third through seventh program states P3 through P7 based on their respective frequencies. Mapping information of the logic states can be included in supplemental data, and read operations can be performed with reference to the supplemental data.

After the logic states have been mapped onto corresponding program states, selected memory cells of nonvolatile memory device 200 are programmed (S440).

In the embodiments of FIGS. 12 and 13, read errors can be reduced by mapping logic states onto program states based on their relative frequency. The mapping of frequent logic states to program states with low threshold voltages can also be used in conjunction with other programming methods described with reference to FIGS. 4 through 11. For instance, in the program methods described with reference to FIGS. 4 through 11, the most frequent logic state can be mapped to erase state E and other logic states can be mapped to first through seventh program states P1 through P7 according to their respective frequencies. Where there are unused logic states, the margins of program states in voltage range ΔV can be selectively varied.

Although the embodiments of FIGS. 12 and 13 relate to memory cells storing 3 bits of data, the inventive concept is not limited to 3-bit memory cells. In alternative embodiments, for instance, nonvolatile memory device 200 can comprise memory cells storing two or more bits each. In addition, although the above-described embodiments relate to memory cells that store data using variable threshold voltages, other embodiments can use memory cells that store data using variable resistance values or other parameters.

Where memory cells to be programmed store "n" bits, the program methods described with reference to FIGS. 4 through 13 can be performed after receiving program data comprising a number of bits greater than or equal to "n" times the number of memory cells to be programmed.

Figure 14:
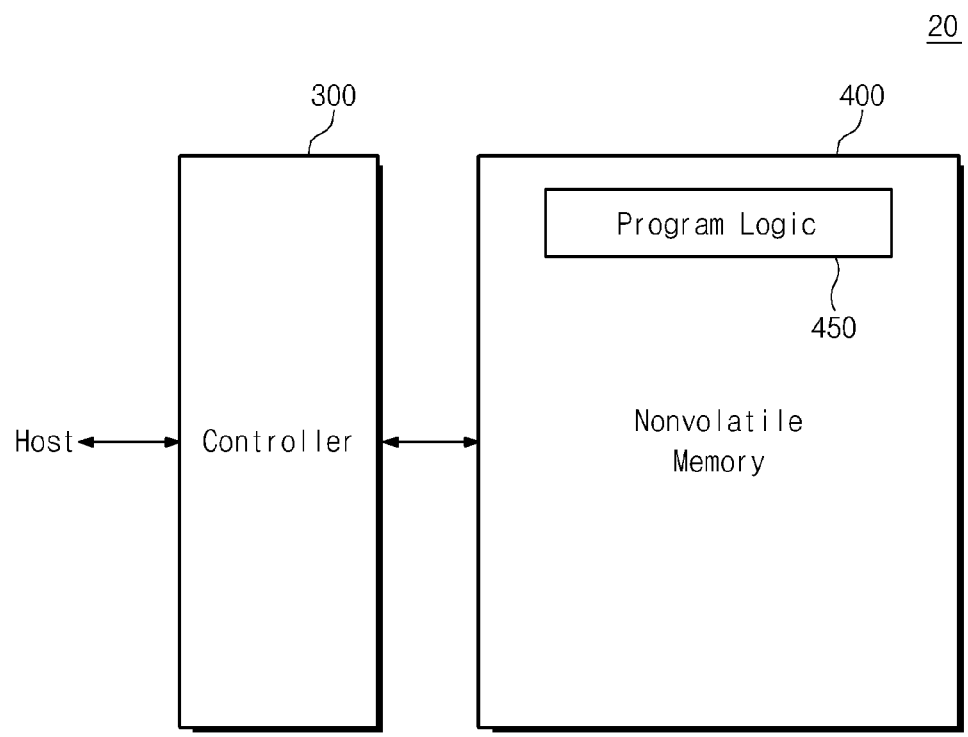
FIG. 14 is a block diagram illustrating a memory system according to another embodiment of the inventive concept.

FIG. 14 is a block diagram illustrating a memory system according to another embodiment of the inventive concept.

Referring to FIG. 14, a memory system 20 comprises a controller 300 and a nonvolatile memory device 400.

Controller 300 has the same configuration as controller 100 of FIG. 2 with the exception that it does not include program logic 140. Thus, a detailed description of controller 300 will be omitted to avoid redundancy. Nonvolatile memory device 400 has the same configuration as nonvolatile memory device 200 of FIG. 3 with the exception that it further comprises program logic 450. Nonvolatile memory device 400 is described below in further detail with reference to FIG. 15.

Controller 300 and nonvolatile memory device 400 can be integrated into a memory card or an SSD as described with reference to FIG. 1. Controller 300 and nonvolatile memory device 400 can also be integrated into any of several electronic systems or devices as described with reference to FIG. 1. Moreover, controller 300 and nonvolatile memory device 400 can be mounted in any of various types of packages.

Figure 15:
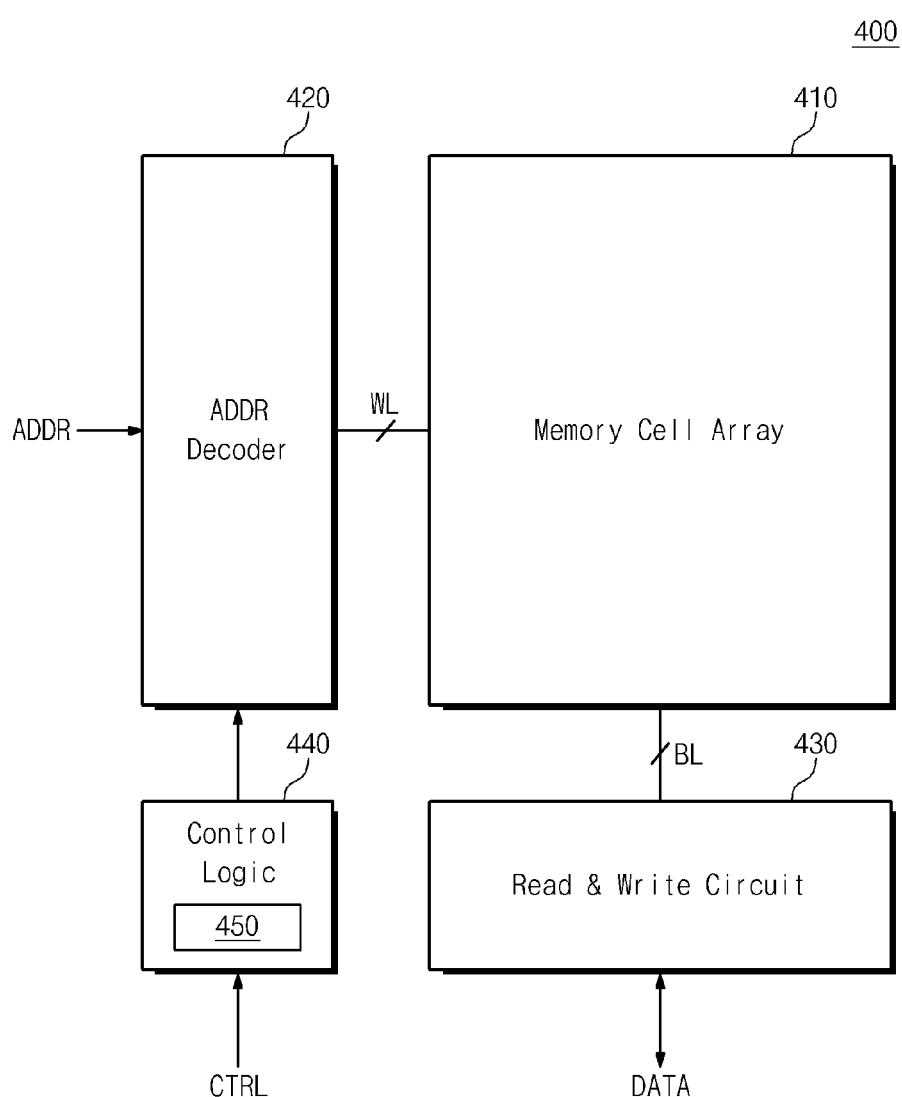
FIG. 15 is a block diagram illustrating an embodiment of a nonvolatile memory device of FIG. 14.

FIG. 15 is a block diagram illustrating an embodiment of nonvolatile memory device 400 of FIG. 14. In the embodiment of FIG. 15, nonvolatile memory device 400 comprises a memory cell array 410, an address decoder 420, a read/write circuit 430, and control logic 440.

Memory cell array 410, address decoder 420 and read/write circuit 430 are configured in the same manner as memory cell array 210, address decoder 220 and read/write circuit 230 described with reference to FIG. 3. Thus, a detailed description of these elements will be omitted to avoid redundancy.

Control logic 440 controls the overall operation of nonvolatile memory device 400 and operates in response to a control signal CTRL. Control signal CTRL can be generated, for instance, by controller 300 of FIG. 14.

Control logic 440 comprises program logic 450, which can be implemented in any of several different forms. For example, program logic 450 can be implemented as software driven by control logic 440, or as an analog circuit, a digital circuit, or a hardware combination of an analog circuit and a digital circuit. Program logic 140 can also be implemented as a combination of software and hardware.

Program logic 450 controls program and read operations of nonvolatile memory device 400. The program and read operations performed by program logic 450 are described below in further detail with reference to FIGS. 16 through 19.

Figure 16:
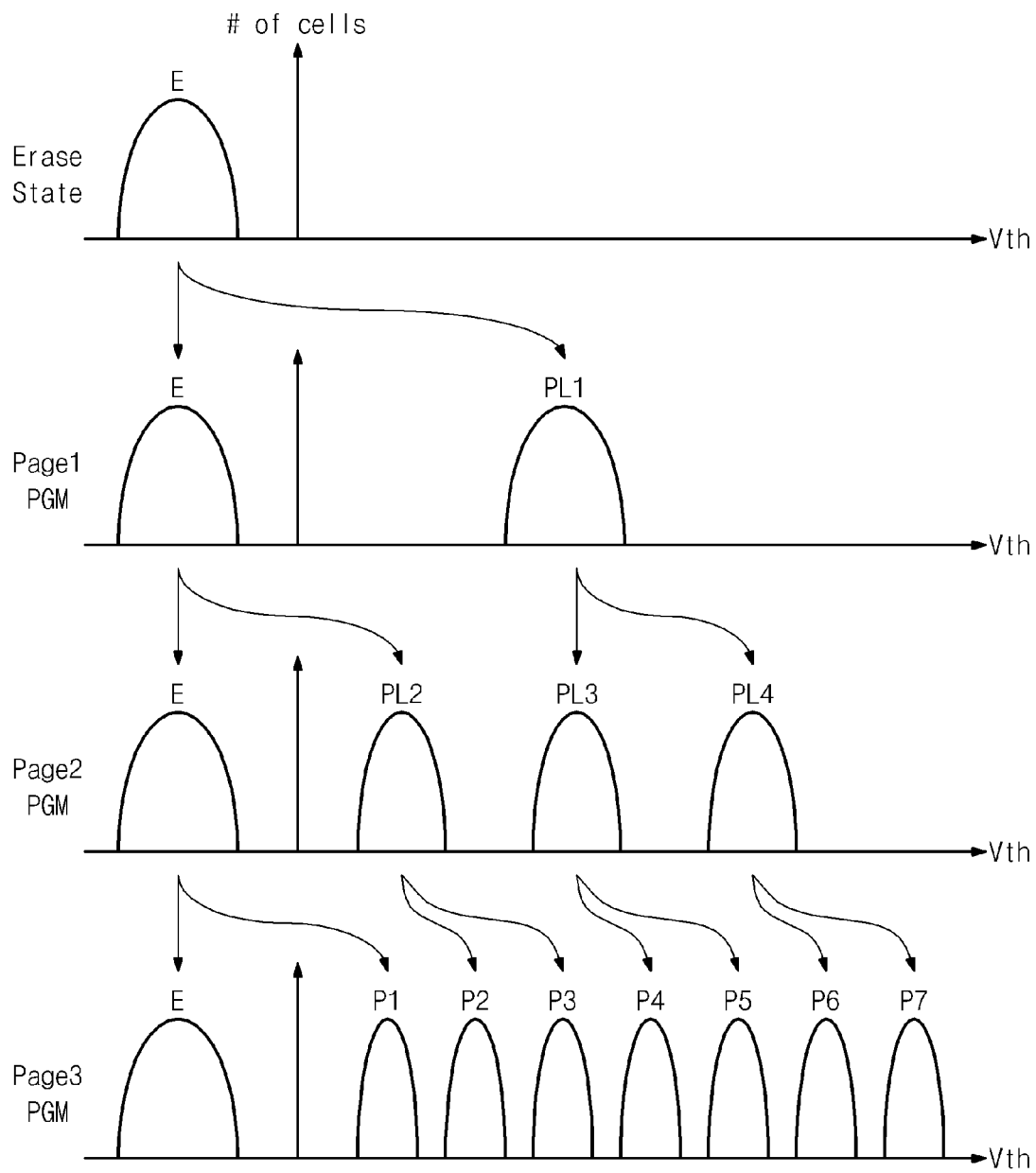
FIGS. 16 through 18 are threshold voltage diagrams illustrating example program states of memory cells programmed in the nonvolatile memory device of FIG. 15.

FIG. 16 is a threshold voltage diagram illustrating example program states of memory cells programmed in nonvolatile memory device 400. In this example each of the memory cells is configured to store 3 bits using eight program states.

In this example it is assumed that nonvolatile memory device 400 is a flash memory device and that read and program operations of nonvolatile memory device 400 are performed on a page basis. Nonvolatile memory device 400 is not limited to a flash memory device, however, and could be implemented as another type of nonvolatile memory, such as a ROM, PROM, EPROM, EEPROM, PRAM, MRAM, RRAM, or FRAM.

Where three bits are stored in each memory cell, each physical page of memory cells in flash memory device 400 comprises three logical pages. For example, each page of memory cells can comprise a logical page of least significant bit (LSB) data, a logical page of central significant bit (CSB) data, and a logical page of most significant bit (MSB) data.

For explanation purposes, it will be assumed that flash memory device 400 performs program operations sequentially from an LSB page to an MSB page. It will also be assumed that the LSB page, a CSB page and the MSB page correspond respectively to a first page Page1, a second page Page2 and a third page Page3.

Referring to FIG. 16, memory cells are programmed from erase state E. In the programming of first page Page1, the memory cells are programmed from erase state E to erase state E and a first central program state PL1.

In the programming of second page Page2, the memory cells are programmed from erase state E to a second central program state PL2, and from first central program state PL1 to third and fourth central program states PL3 and PL4.

In the programming of third page Page3, the memory cells are programmed from erase state E to erase state E and a first program state P1, from second central program state PL2 to second and third program states P2 and P3, from third central program state PL3 to fourth and fifth program states P4 and P5, and from fourth central program state PL4 to sixth and seventh program states P6 and P7.

Figure 17:
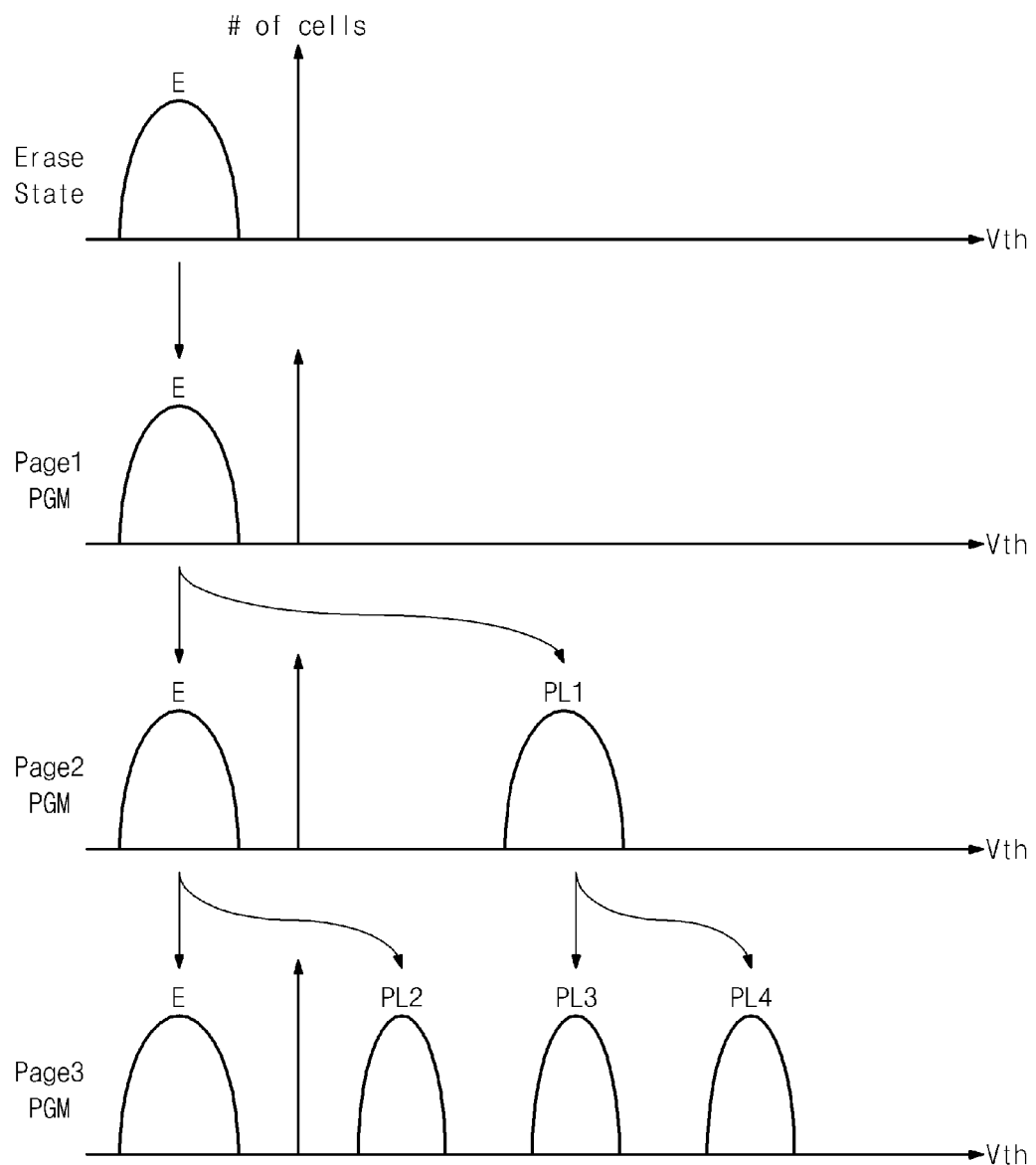

FIG. 17 is a threshold voltage diagram illustrating example logic states of data programmed in program logic 450 of FIG. 15. In the example of FIG. 17, it is assumed that all of the program data received by nonvolatile memory device 400 has the same value for first page Page1. In particular, it is assumed that all of the program data for first page Page1 is logical "1". Accordingly, all logic states with a least significant bit of logical "0" are unused logic states.

Referring to FIG. 17, memory cells begin in erase state E. Because all of the program data has a logical "1" for LSB data, the memory cells remain in erase state E after programming of first page Page1, and information indicating that the memory cells all have LSB data of logical "1" is stored as supplemental data.

In an alternative example, where all of the program data for first page Page1 is logical "0", the memory cells can also be maintained in erase state E during programming of first page Page1, and information indicating that the memory cells all have LSB data of logical "0" can be stored as supplemental data.

In the programming of second page Page2, the memory cells are programmed from erase state E to erase state E and first central program state PL1. In the programming of third page Page3, the memory cells are programmed from erase state E to erase state E and second central program state PL2, and from first central program state PL1 to third and fourth central program states PL3 and PL4.

By comparison with FIG. 16, FIG. 17 has fewer program states after the programming of third page Page3. Additionally, the program states of FIG. 17 have larger margins than those of FIG. 16, and therefore the reliability of flash memory device 400 can be improved by using the programming techniques described in relation to FIG. 17.

Figure 18:
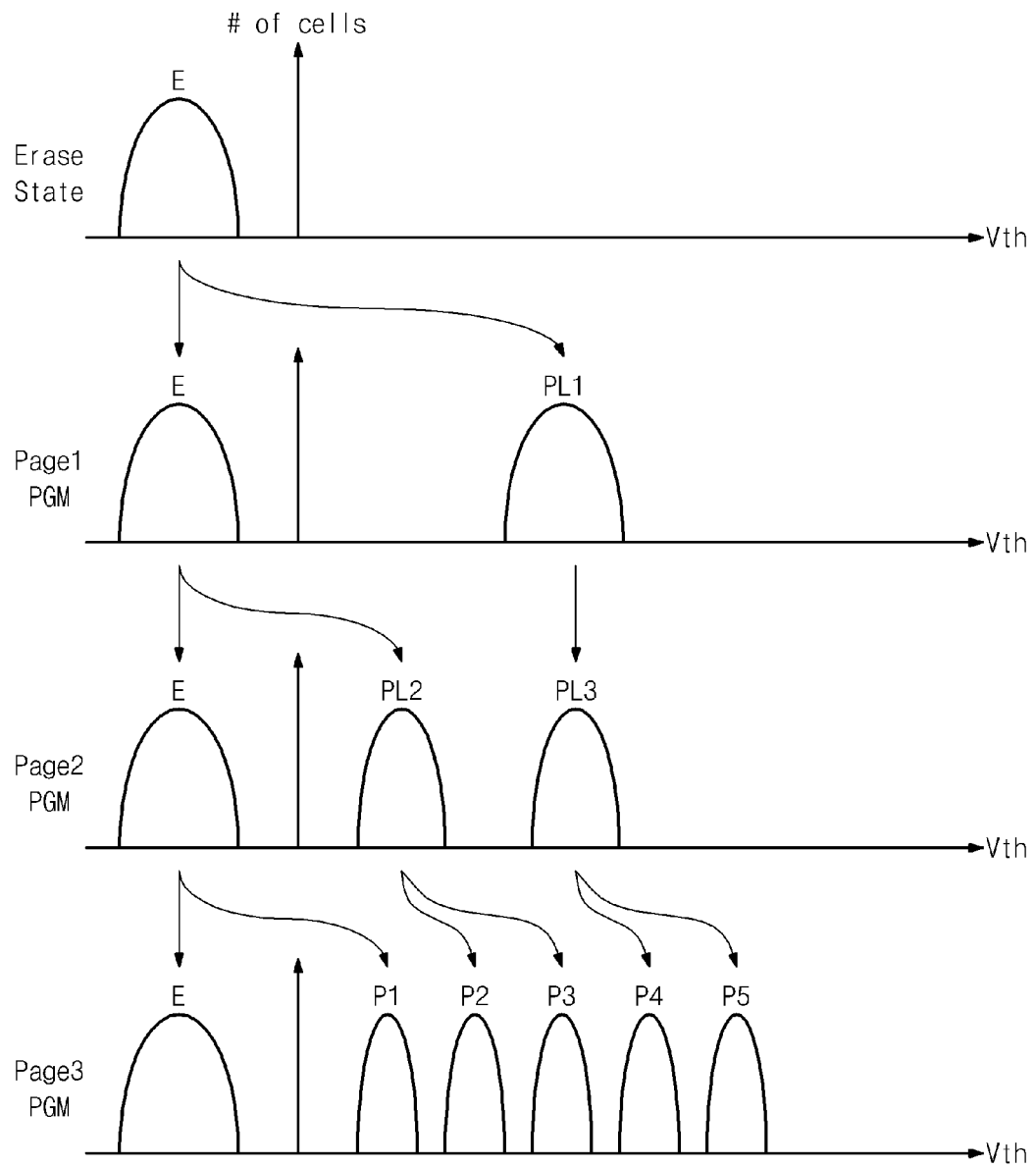

FIG. 18 is a diagram illustrating example program states of memory cells in nonvolatile memory device 400 of FIG. 15. In the example of FIG. 18, unused logic states occur because of the logic states of program data in second page Page2.

In the programming of first page Page1, the memory cells are programmed from erase state E to erase state E and first central program state PL1.

In the programming of second page Page2, the memory cells are programmed from erase state E to erase state E and second central program state PL2, and from first central program state PL1 to third central program state PL3. The program data for second page Page2, however, does not comprise data corresponding to fourth central program state PL4.

In the programming of third page Page3, the memory cells are programmed from erase state E to erase state E and first program state P1, from second central program state PL2 to second and third program states P2 and P3, and from third central program state PL3 to fourth and fifth program states P4 and P5.

In comparison with the FIG. 16, the embodiment of FIG. 18 has unused sixth and seventh program states P6 and P7. Accordingly, the programmed memory cells may experience reduced charge loss compared with programmed memory cells of FIG. 16. Additionally, in some embodiments, the margins of the remaining program states can be varied to reduce read error due to the charge loss can be reduced.

In certain variations of the embodiment of FIG. 18, logic states assigned to second or third central program state PL2 or PL3 (instead of fourth central program state PL4) can be unused in the programming of second page Page2. Rather than omitting these other program states, the corresponding logic state of fourth central program state PL4 can be reassigned to second or third central program state PL2 or PL3 and the same program state configuration can be used. Additionally, information indicating this reassignment can be stored as supplemental data.

The method described with reference to FIGS. 5 through 7 or the method described with reference to FIGS. 8 and 9 can be used to program third page Page3. For instance, where an unused logic state determines that one or more program states are not used in the programming of third page Page3, the methods of FIGS. 5 through 7 or FIGS. 8 and 9 can be used to adjust the program states that are used.

Figure 19:
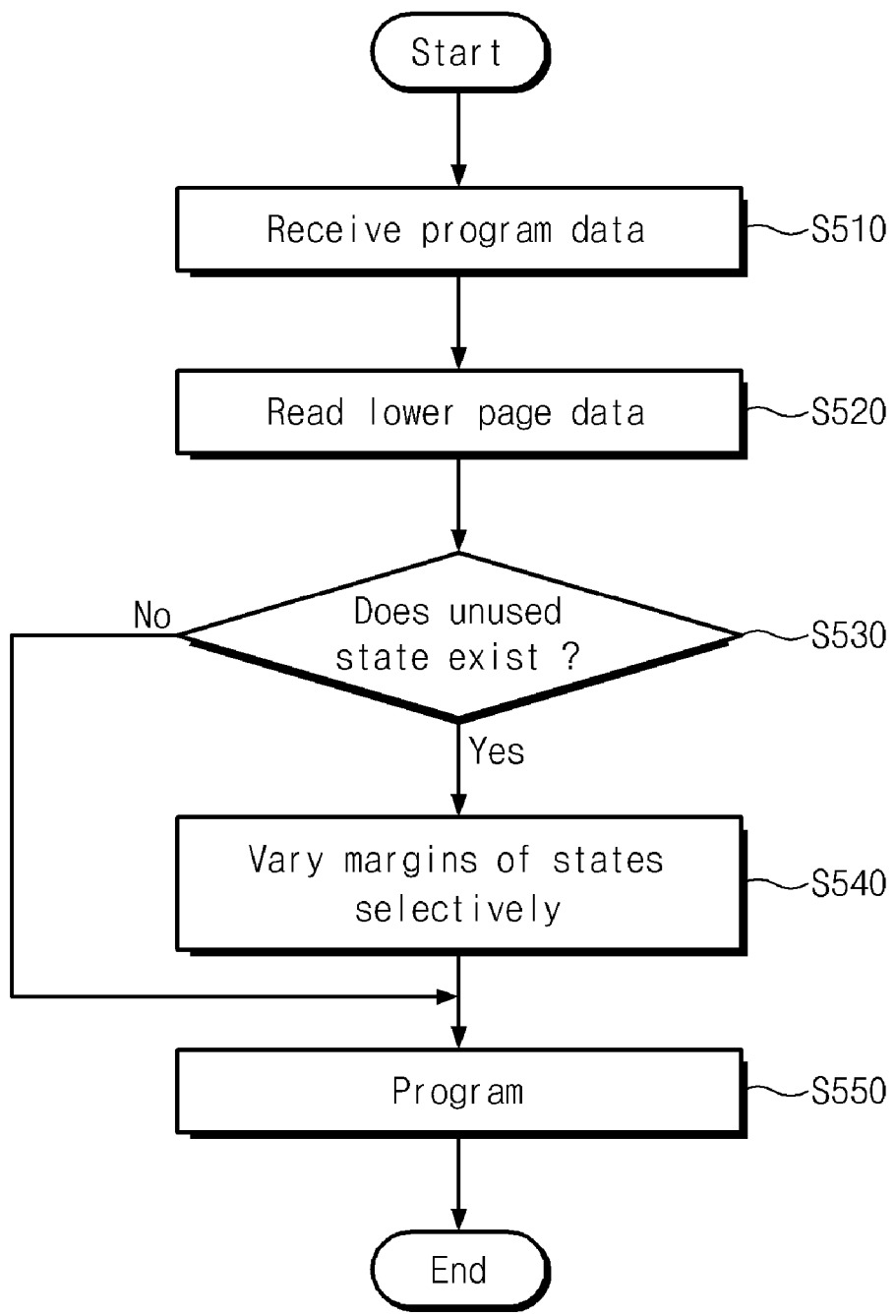
FIG. 19 is a flowchart illustrating a method of operating the program logic of FIG. 15 to perform program operations described with reference to FIGS. 16 through 18.

FIG. 19 is a flowchart illustrating a method of operating program logic 450 of FIG. 15 to perform a program operation described with reference to FIGS. 16 through 18.

Referring to FIGS. 15 and 19, program logic 450 receives program data (S510). The program data can be received, for instance, from controller 300 of FIG. 14. In this example it is assumed that the received program data is third page Page3 data, and the program data is loaded into read/write circuit 430.

Next, lower page data is read (S520). Because the program data is third page Page3 data, first page Page1 data and second page Page2 constitute lower page data. The read lower page data is typically loaded into read/write circuit 430.

Thereafter, program logic 450 determines whether there is an unused logic state (S530). It typically accomplishes this by analyzing the received program data and the read lower page data. For instance, program logic 450 can determine whether programming the received program data would result in one or more unused program states.

Where there is no unused logic state (S530=No), a normal program operation is performed (S550). Otherwise, where there is an unused logic state (S530=Yes), the margins of program states are selectively varied (S540). For instance, the margins can be controlled to be equalized as described with reference to FIGS. 4 through 7. In certain embodiments, this is accomplished by modifying verify voltages used to achieve the program states. In some embodiments, program logic 450 modifies the verify voltages by selecting a set of verify voltages from among predetermined sets of verify voltages, or by selecting a set of verify voltages and a set of program voltages.

Following step S540, a program operation is performed with the varied margins (S550). Program logic 450 can control flash memory device 400 to perform the program operation using the varied margins. Program logic 450 can use a set of selected verify voltages to control the memory cells to be programmed. Program logic 450 can also use a set of selected verify voltages and the set of selected program voltages to control the memory cells to be programmed.

In the embodiment of FIGS. 18 and 19, first and second pages Page1 and Page 2 can be normal-programmed, and third page Page3 can be programmed using margins that have been selectively varied as in the embodiments of FIGS. 4 through 7. Thus, the reliability of nonvolatile memory device 200 can be improved. In certain embodiments, where the program data for programming first page Page1 contains an unused logic state, the programming of third page Page3 can be omitted as illustrated in FIG. 17. Thus, the reliability of nonvolatile memory device 200 can be improved.

In the program methods of FIGS. 4 through 13 program logic 140 controls programming of selected memory cells. However, in alternative embodiments, these program methods can be performed using program logic 450 of FIG. 14. In other words, the program data can be stored in read/write circuit 430 and program logic 450 can vary the margins of the program states based on the program data stored in read/write circuit 430, as described with reference to FIGS. 4 through 13.

Figure 20:
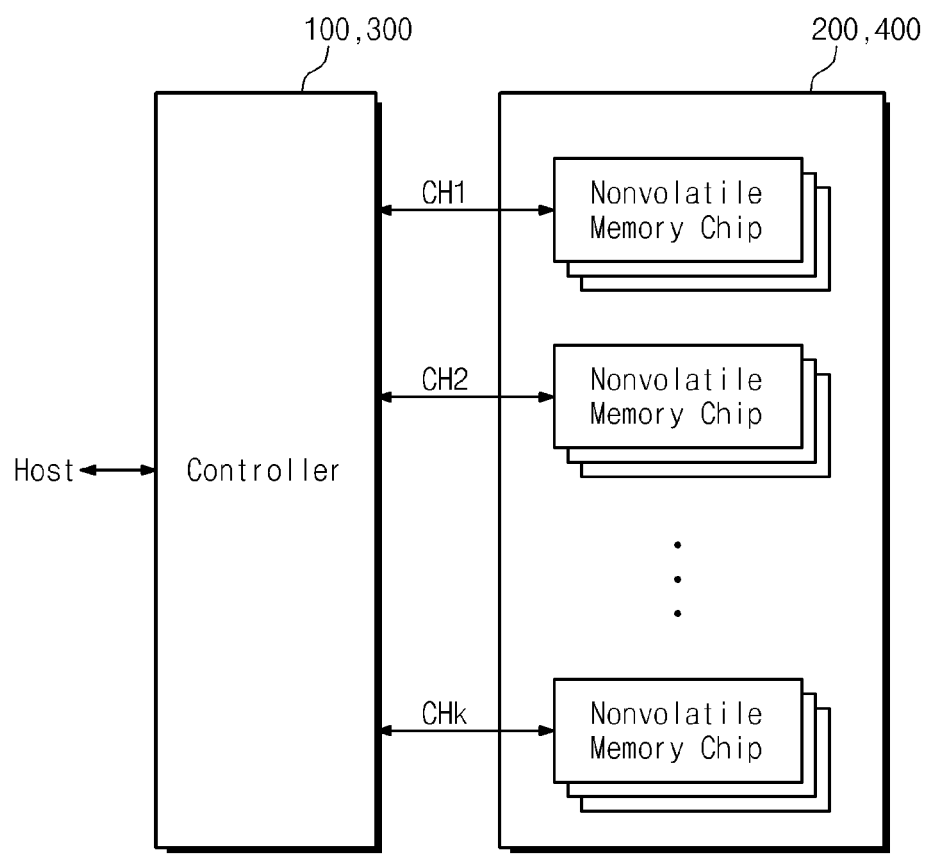
FIG. 20 is a block diagram illustrating a memory system that is a variation of the memory system illustrated in FIG. 1 or FIG. 14.

FIG. 20 is a block diagram illustrating a memory system that is a variation of memory system 10 of FIG. 1 or memory system 20 of FIG. 14.

Referring to FIG. 20, memory system 10 or 20 (hereafter, "memory system 10/20") comprises controller 100 or 300 (hereafter, controller 100/300) and nonvolatile memory device 200 or 400 (hereafter, nonvolatile memory device 200/400). Nonvolatile memory device 200/400 comprises a plurality of nonvolatile memory chips divided into a plurality of groups. Each group of the nonvolatile memory chips is configured to communicate with controller 100/300 through one channel. In the example of FIG. 20 the nonvolatile memory chips communicate with controller 100/300 via first through $k^{th}$ channels CH1 through CHk. Each of the nonvolatile memory chips can be configured in the same manner as nonvolatile memory device 200 or 400 described with reference to FIG. 3 or 15.

Figure 21:
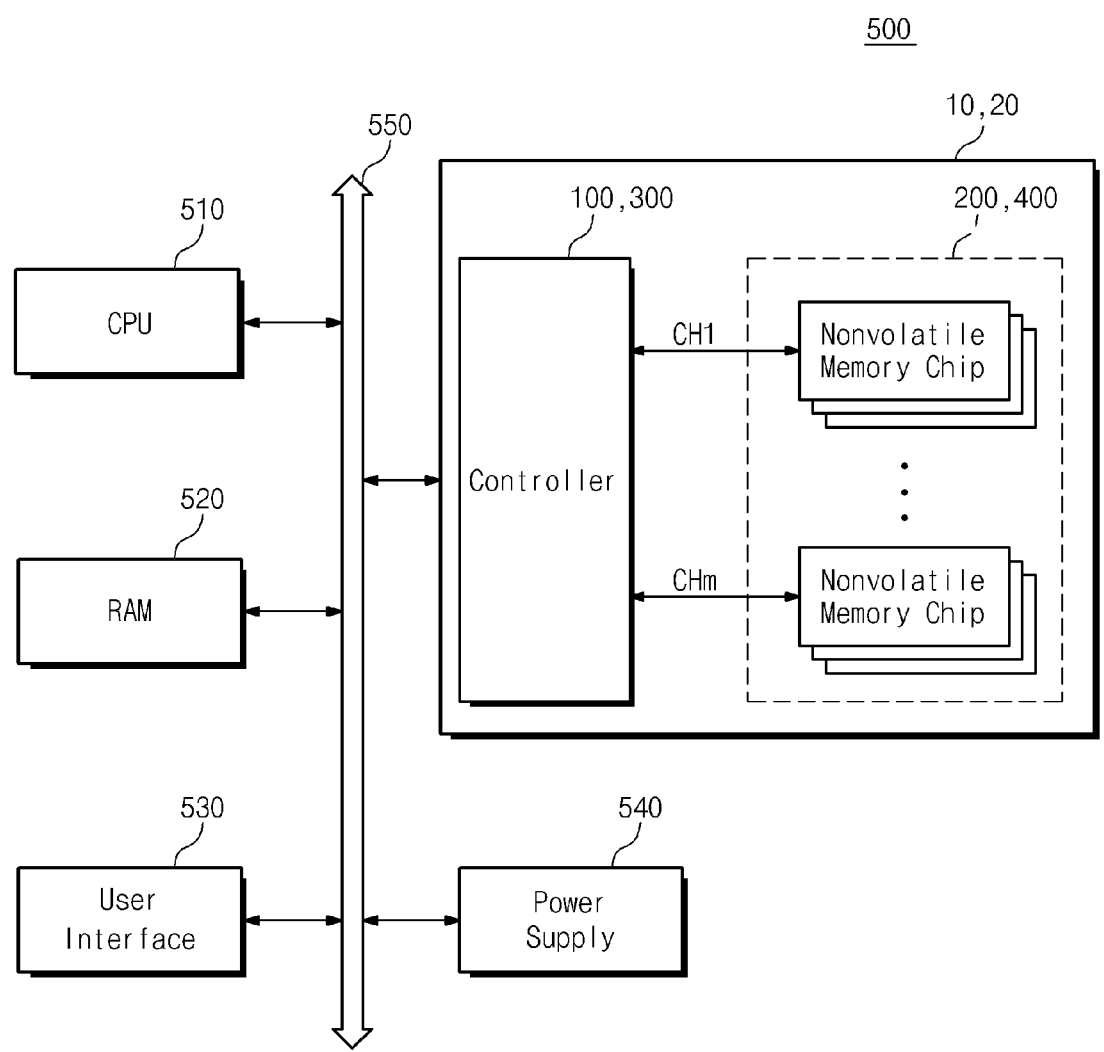
FIG. 21 is a block diagram illustrating a computing system comprising the memory system of FIG. 1 or 14.

FIG. 21 is a block diagram illustrating a computing system 500 comprising memory system 10 of FIG. 1 or memory system 20 of FIG. 14.

Referring to FIG. 21, computing system 500 comprises a central processing unit (CPU) 510, a RAM 520, a user interface 530, a power supply 540, and memory system 10/20.

Memory system 10/20 is electrically connected by a system bus 550 to CPU 510, RAM 520, user interface 530 and power supply 540. Data provided through user interface 530 or processed by CPU 510 is stored in memory system 10/20. Memory system 10/20 comprises controller 100/300 and nonvolatile memory device 200/400.

In this example, nonvolatile memory device 200/400 comprises a plurality of nonvolatile memory chips divided into a plurality of groups. Each group of nonvolatile memory chips is configured to communicate with controller 100/300 through a common channel. For instance, in the example of FIG. 21, the nonvolatile memory chips communicate with controller 100/300 through first through $m^{th}$ channels CH1 through CHm.

Where memory system 10/20 comprises an SSD, the booting speed of computing system 500 can increase significantly. Although not illustrated in FIG. 21, computing system 500 can further comprise an application chipset or a camera image processor.

As described above, the inventive concepts of the present invention are described referring technical features of adjusting margins. However, it will be understood that the adjusting margins can be translated into adjusting levels of verify voltages to be used during a subsequent programming.

In various embodiments described above, certain programming techniques are used to vary the margins of the program states based on the logic states contained in program data, and/or the frequency of those logic states. These programming techniques can improve the margins of program states and improve the reliability of nonvolatile memory devices.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of programming a nonvolatile memory device, comprising:
    receiving program data;
    detecting logic states of the received program data;
    identifying adjusted margins to be applied to programmed memory cells based on the absence of one or more logic states in the detected logic states; and
    programming the program data in selected memory cells using the adjusted margins.

2. The method of claim 1, wherein the absence of one or more logic states is detected by comparing a number of program states available to each of the selected memory cells with a number of distinct logic states in the program data.

3. The method of claim 2, wherein the program data is determined to have an absent logic state where the number of program states available to the memory cells is greater than the number of distinct logic states in the program data.

4. The method of claim 1, wherein each of selected the memory cells is configured to store at least three bits.

5. The method of claim 2, wherein the adjusted margins are adjusted to account for omission of one of the available program states corresponding to the absent logic state; and
wherein the adjusted margins are configured to separate program states of the selected memory cells by substantially equal amounts.

6. The method of claim 1, further comprising counting a number of occurrences of each of the logic states in the program data.

7. The method of claim 6, further comprising adjusting the margins such that a largest margin is assigned to a program state corresponding to a logic state having a largest number of occurrences.

8. The method of claim 6, further comprising adjusting the margins such that larger margins are assigned to program states corresponding to logic states having more occurrences.

9. The method of claim 1, wherein detecting the logic states of the received program data comprises:
reading data stored in the nonvolatile memory device; and
analyzing the stored data and the program data.

10. The method of claim 1, further comprising:
generating a mapping between the detected logic states and the program states based on which logic states are absent from the detected logic states.

11. The method of claim 1, further comprising:
storing supplemental data in the selected memory cells to indicate the adjusted margins used to program the program data.

12. A method of programming a nonvolatile memory device, comprising:
receiving program data;
counting frequencies of logic states in the received program data;
selecting adjusted margins to be applied to programmed memory cells based on the counted frequencies; and
programming the program data in selected memory cells using the adjusted margins.

13. The method of claim 12, wherein selecting the adjusted margins comprises selecting a first margin for a first logic state having a first counted frequency, and selecting a second margin larger than the first margin for a second logic state having a second counted frequency larger than the first counted frequency.

14. The method of claim 12, further comprising:
storing supplemental data in the selected memory cells to indicate the adjusted margins used to program the program data.

15. The method of claim 12, further comprising:
reading the program data from the selected memory cells based on the adjusted margins indicated by the supplemental data.

16. The method of claim 12, wherein the selecting the adjusted margins comprises:
selecting levels of verify voltages to be used during the programming the program data.

17. A nonvolatile memory system comprising:
a nonvolatile memory device comprising a plurality of multi-bit memory cells configured to store program data using a plurality of program states; and
a controller configured to receive program data to be programmed in the memory cells, detect logic states contained in the program data, select adjusted margins to be applied to programmed memory cells based on the absence of one or more logic states in the detected logic states, and store the program data in selected memory cells using the adjusted margins.

18. The nonvolatile memory system of claim 17, wherein the program states correspond to distinct threshold voltage distributions.

19. The nonvolatile memory system of claim 17, wherein the program states correspond to distinct resistance distributions.

20. The nonvolatile memory system of claim 17, wherein the nonvolatile memory device and controller are incorporated in a solid state drive.

* * * * *